(12) United States Patent
Verdecchio et al.

(10) Patent No.: US 6,957,117 B2
(45) Date of Patent: Oct. 18, 2005

(54) PORTABLE PROTECTIVE AIR GAP TOOL AND METHOD

(75) Inventors: Thomas A. Verdecchio, Tabernacle, NJ (US); Raymond Ferraro, Howell, NJ (US); George Gela, Pittsfield, MA (US)

(73) Assignee: Public Service Electric and Gas Company, Newark, NJ (US)

( * ) Notice: Subject to any disclaimer, the term of this patent is extended or adjusted under 35 U.S.C. 154(b) by 40 days.

(21) Appl. No.: 10/266,235

(22) Filed: Oct. 8, 2002

(65) Prior Publication Data

US 2003/0069657 A1 Apr. 10, 2003

Related U.S. Application Data

(60) Provisional application No. 60/327,935, filed on Oct. 9, 2001.

(51) Int. Cl.[7] .............................................. G06F 19/00
(52) U.S. Cl. ......................... 700/117; 700/292; 361/12; 361/117
(58) Field of Search ................................. 700/286, 292, 700/293, 294, 117; 361/12, 117, 120, 129, 130, 137; 174/3, 4 R

(56) References Cited

U.S. PATENT DOCUMENTS

| | | | | |
|---|---|---|---|---|
| 4,665,460 A | * | 5/1987 | Schaff | 361/137 |
| 4,752,854 A | * | 6/1988 | Lefort et al. | 361/117 |
| 4,801,937 A | * | 1/1989 | Fernandes | 340/870.16 |
| 4,871,972 A | * | 10/1989 | Roy et al. | 324/551 |
| 5,181,026 A | * | 1/1993 | Granville | 340/870.28 |
| 5,194,850 A | * | 3/1993 | Bourrieres et al. | 340/660 |
| 5,663,863 A | * | 9/1997 | Ohashi et al. | 361/118 |
| 6,108,187 A | * | 8/2000 | Podporkin et al. | 361/117 |
| 6,442,493 B1 | * | 8/2002 | Jurisch et al. | 702/59 |
| 6,601,001 B1 | * | 7/2003 | Moore | 702/59 |

* cited by examiner

*Primary Examiner*—Leo Picard
*Assistant Examiner*—Zoila Cabrera
(74) *Attorney, Agent, or Firm*—W. Patrick Quast, Esq.

(57) ABSTRACT

A method for designing and validating a portable protective air gap (PPAG) device for use by workmen doing live-line maintenance on a electrical voltage transmission line network. The method sets out the procedure for optimizing the starting gap distance for a particular PPAG to be used for a given nominal system voltage. Validation testing then follows to achieve final, recommended values. PPAG devices employing axially aligned, hemispherically tipped, first and second electrodes for use on 115/138 kV, 230 kV and 345 kV voltage networks are designed using the methodology of the invention.

28 Claims, 17 Drawing Sheets

FIG. 7

Generator configurations used in this project.

| Mockup tested | Stages used |
|---|---|
| 115/138 kV | 4 with PPAG, 8 without PPAG |
| 230 kV | 5 or 6 with PPAG, 11 without PPAG |
| 345 kV | 7 with PPAG, 11 without PPAG |

FIG. 8

External front resistors for various wave shapes.

| Nominal Front time (µs) | Resistor (kΩ) | Additional capacitance (nF) |
|---|---|---|
| 55 | 1 | - |
| 105 | 2 | - |
| 140 | 3 | - |
| 180 | 4 | - |
| 210 | 4 | 6.2 (center phase) |

FIG. 9

Tested configurations

| Voltage | Construction | Configuration | Phase | Gap (inch) | Wave front (µs) |
|---|---|---|---|---|---|
| 138 kV | Lattice | Vertical | Top | None, 11.5, 12 | 55, 105, 140, 180 |
| 138 kV | Lattice | Vertical | Bottom | None, 11.5, 12 | 105, 140, 180 |
| 230 kV | Lattice | Vertical | Top | None, 18.5, 19.5 | 105, 140, 180 |
| 230 kV | Lattice | Vertical | Bottom | None, 18.5, 19.5 | 105, 140, 180 |
| 230 kV | Lattice | Horizontal | Outer | None, 18.5, 19.5 | 105, 140, 180 |
| 230 kV | Lattice | Horizontal | Middle | None, 18.5, 19.5 | 105, 140, 180 |
| 230 kV | Pole | Vertical | Top | None, 18.5, 19.5 | 105, 140, 180 |
| 230 kV | Pole | Vertical | Bottom | None, 18.5, 19.5 | 55, 105, 140, 180 |
| 345 kV | Lattice | Horizontal | Middle | None, 31, 32.5 | 105, 140, 180, 210 |
| 345 kV | Lattice | Vertical | Bottom | None, 32.5 | 105, 140, 180, 210 |
| PPAG in Free Space | - | - | - | 11.5, 12, 18.5, 19.5, 31, 32.5 | 105, 140, 180 |

Plot of positive DC sparkover voltage of a rod-plane gap versus gap length for the three electrode shapes indicated.

FIG. 11

Calculated PPAG Distance Values, D, for 115/138 kV System.

| Method | Gap Distance (inches/mm) |
|---|---|
| 1. Test data for horizontal rod-rod gap | 11.5/292.1 |
| 2. Test data for vertical rod-rod gap | 11.5/292.1 |
| 3. IEEE Std 516 | 13.1/332.7 |
| 4. CRIEPI formula | 13.0/330.2 |
| 5. Lemke formula | 11.8/299.7 |

FIG. 12

Calculated PPAG Distance Values, D, for 230 kV System.

| Method | Gap Distance (inches/mm) |
|---|---|
| 1. Test data for horizontal rod-rod gap | 19.8/502.9 |
| 2. Test data for vertical rod-rod gap | 22.2/563.9 |
| 3. IEEE Std 516 | 21.8/545.0 |
| 4. CRIEPI formula | 22.8/579.1 |
| 5. Lemke formula | 20.8/528.3 |

FIG. 13

Calculated PPAG Distance Values, D, for 345 kV System.

| Method | Gap Distance (inches/mm) |
|---|---|
| 1. Test data for horizontal rod-rod gap | 30.7/779.8 |
| 2. Test data for vertical rod-rod gap | 34.8/883.9 |
| 3. IEEE Std 516 | 32.6/828.0 |
| 4. CRIEPI formula | 36.4/924.6 |
| 5. Lemke formula | 32.1/815.3 |

FIG. 16

Examples of the Effect of Various Electrode Geometries on Sparkover Voltage $U_S$ of Air Gaps Energized with Power Frequency AC.

| Gap Type | Gap Length, D (m) | $U_s$ (kV$_{peak}$) |
|---|---|---|
| Rod-to-plane, flat cut rods | 0.254 | 126 |
| | 0.508 | 253 |
| | 1.016 | 509 |
| Rod-to-rod, standard horizontal | 0.25 | 143 |
| | 0.50 | 270 |
| | 1.0 | 520 |
| Sphere-to-plane, horizontal | 0.254 | 302 |
| | 0.508 | 383 |
| | 1.016 | 480 |
| Hoop-to-plane, edge | 0.224 | 192 |
| | 0.50 | 745 |
| | 1.0 | 1206 |
| Worker-to-tower | 1.1 | 516 |
| Parallel plates | 0.254 | 762 |
| | 0.508 | 1524 |
| | 1.016 | 3048 |

FIG. 17

Effect of Voltage Type on Sparkover of Air Gaps.

| Gap Type | Voltage Type | Gap Length, D (m) | $V_s$ or $V_{50}$ (kV$_{peak}$) |
|---|---|---|---|
| | | 0.254 | 126 |
| | AC | 0.508 | 253 |
| | | 1.016 | 509 |
| | DC | 0.25 | +113 ... +134 |
| | Lightning | 0.50 | +274 |
| Rod-to-plane | | 1.0 | +550 ... +598 |
| flat cut rods | | 0.254 | +120 ... +211 |
| | Fast front | 0.508 | +280 ... +425 |
| | | 1.016 | +540 ... +821 |
| | | 0.20 | +100 ... +110 |
| | Switching | 0.50 | +229 ... +259 |
| | | 1.0 | +370 ... +510 |
| | | 0.224 | 192 |
| | AC | 0.50 | 745 |
| Hoop-to-plane | | 1.0 | 761 ... 1206 |
| (various gaps) | DC | 0.2 | +175 ... +260 |
| | Fast front | 1.0 | +508 ... +517 |
| | Switching | 1.0 | +455 ... +1170 |

FIG. 18

Switching Impulse Wave Shape Effects on $U_{50}$ of a Vertical 0.5 m Rod-to-Plane Air Gap.

| $t_{cr}$ (µs) | $U_{50}$ (kV) |
|---|---|
| 1.2 x 50 | +274 |
| 1.5 x 40 | +420 |
| 3 | +370 |
| 4 | +350 |
| 8 | +290 |
| 12 | +280 |
| 50 | +259 |
| 50 x 3000 | +250 |
| 170 x 2500 | +229 |
| 170 x 3000 | +255 |

FIG. 19

The Effects of Voltage Polarity on Sparkover Voltage of an Asymmetrical Vertical 0.5 m Rod-to-Plane Air Gap.

| Wave Shape (µs) | Positive (kV) | Negative (kV) |
|---|---|---|
| 2 | +425 | -590 |
| 3 | +370 | -550 |
| 4 | +350 | -530 |

Electrode length (L) based on maximum distance (D) anticipated

| Voltage Class | Recommended Gap Distance (D) (inches) | Range of Adjustment (inches) | Estimated Electrode Length (L) excluding Threads (inches) | Electrode Threads (T) (inches) | Steel Female Collar Internal Threads (inches) | Base Gap Distance With Collar No Electrode (inches) |
|---|---|---|---|---|---|---|
| 500 | 41 | - | - | - | - | - |
| 115/138 | 9.5 - 12.5 | 3 | 22.5 | 5 | 5 | 35 |
| 230 | 17 - 21 | 4 | 14 | 5 | 5 | 35 |
| 345 | 29 - 33 | 4 | 2 | 5 | 5 | 35 |
| 4/10/00 | | | | | | |

PORTABLE PROTECTIVE AIR GAP TOOL AND METHOD

This application claims the benefit of U.S. Provisional Application No.: 60/327,935, filed Oct. 9, 2001.

BACKGROUND

1. Field of the Invention

This invention relates to safety devices for use during maintenance work on live, high voltage electrical transmission lines and more particularly to portable protective air gap devices employed in such circumstances and related methodology for designing such devices for differing line voltage systems.

2. Background of the Invention

Of course, high voltage, electrical transmission systems require routine maintenance to ensure their continuing integrity. A majority of utilities in the country resort to inactivating the line segment under repair resulting in temporary but costly inconveniences to users.

A small number of utilities have sought to develop tools and techniques which will allow for maintenance of these lines while still energized. Standards for such maintenance efforts exist, including the IEEE's Standard 516, *"Guide For Maintenance Methods On Energized Power Lines"* and OSHA's Regulation, 29 CFR 1910.269.

A major safety concern surrounding such live line work is the presence of overvoltages on the line. Overvoltages are voltage levels that are in excess of the normal power frequency system voltage. They occur for various reasons, the more common of which are lightning, switching operations and line faults.

The principal area of concern, realistically speaking, under standards set for live line maintenance are overvoltages due to switching operations. These very high overvoltages occur when, for example, a line breaker opens a breaker to clear a single-phase fault; or, a line breaker attempts to re-close a line following a momentary single-phase fault clearing operation. Both acts give rise to the overvoltage condition; but the act of reclosing most often gives rise to higher overvoltages.

The clearances to transmission line tower structures are designed to withstand these overvoltages. However the presence of tools and workers at the worksite, and other factors, such as broken insulators, lower the worksite "withstand voltage", and a breakdown can occur when a sufficiently high, switching surge reaches the worksite. Thus a need for protection exists.

One approach to reducing the magnitude of worksite, overvoltages is to block the re-closure of a circuit breaker—i.e., the breaker is prevented from re-closing following the first trip signal. This will eliminate the source of the very high overvoltages at the worksite. However, this blocking feature cannot be visually confirmed by the line workers, so that its effectiveness is questionable, certainly, at least, in so far as the psychological needs of the line workers. Blocking reclosures also do not guarantee that overvoltages resulting from the sole act of opening the breaker are sufficiently, acceptably low for worksite withstand voltage.

Another approach that is employed to enhance workers' safety in the live line maintenance scenario is to employ what is referred to as a portable protective air gap device (PPAG). This tool seeks to assure positive control at the worksite itself over the maximum voltage that can electrically stress the air gap at a worksite.

With safety as its primary consideration, the assignee hereof has chosen to employ PPAGs as the most direct and visible (to the work crew) method of worksite overvoltage control. The PPAG will spark over at a predetermined voltage that will prevent possible sparkover at the worksite. These tools can allow the worker's minimum approach distance (MAD), determined without the use of the PPAG, to be reduced to a withstand distance coordinated with the sparkover voltage of the PPAG. By reducing the MAD, the use of shorter and lighter tools and better control by the worker in handling tools and small parts is facilitated.

Heretofore the Assignee hereof, PSE&G, has employed a particular design of PPAG in live line work on its 500 kV systems. The tool employed includes a fiberglass insulating rod or "hot stick", available from A.B. Chance Co. of Centralia, Mo. The tool includes two permanently installed electrodes positioned on the rod to form a horn shaped air gap. One electrode is connected to a live line through an appropriate clamp. The remaining electrode is connected through an appropriate clamp and cable, to the tower structure at ground potential. FIG. 1 depicts the prior art tool of the Assignee herein which was designed for use on 500 kV lines. For that application, the air distance between the rods forming the horn-shaped air gap is 41". This tool was developed in the 1970's through an extensive trial and error program, which lasted until something was achieved that worked.

As noted above, PPAGs are used to enhance the safety at a worksite where maintenance on live electrical transmission lines is to take place. The function is to limit overvoltage conditions at the worksite on the line under repair. The fact that the tool is set up by the lineman himself according to procedures in which he is trained enhances the psychological advantages of this technique.

In addition to the PPAG depicted as prior art in FIG. 1, alternative approaches have been evaluated. One uses two hollow spheres each positioned at the end of a rod connected respectively to a live line and ground. These spheres are susceptible to denting and other damage. As a result the practical utilization of this technique is minimal. Another approach involves the use of one sphere cooperating with a flat, sheet-like electrode to define the air gap. This suffers from the denting problems associated with spheres and is otherwise unwieldy for practical application.

Because of the somewhat random character of sparkover, the exact values of the spark-over voltage cannot be determined by tests. For practical reasons, therefore, the probability of spark over at a specific line voltage value must be ascertained with consideration given to worksite structures and conditions.

It also became apparent that to extend live line maintenance capability to a majority of the transmission voltage schemes presently employed by utilities, a PPAG device adaptable so as to be employed with a breadth of line voltages is desirable.

At voltages of 345 kV and above, insulated hotstick tools are bulky, heavy, and, because of their length, difficult to control without the use of a shepherd hook or nonconductive rope. A practical, workable answer is required.

OBJECTS OF THE PRESENT INVENTION

It is a primary object of this invention to provide a methodology to practically determine desired air gap distances for a respective PPAG as may be employed with a particular line voltage, with a given worksite structure and worksite conditions.

It is an object of the present invention to provide a PPAG tool design readily useable with a variety of transmission line voltages.

It is still another object of this invention to provide a basic tool element which is adaptable for subsequent use with a variety of transmission line voltages.

It is yet another object of this invention to enhance the worker's psychological mindset by providing a PPAG tool familiar to the workman and which is installed by him in accordance with proven procedures.

It is yet another object of this invention to provide a PPAG which is optimized in size and weight for the line voltage involved, so as to permit use of more manageable (shorter and lighter) tools especially at higher line voltages.

It is still a further object to provide a PPAG design and resulting product that is beneficial on all circuits at all voltages, especially on compact designs and where normal phase to-phase and phase-to-ground distances have been reduced.

The accomplishment of the above objects and advantages and numerous others will be evident after a consideration of the accompanying drawings and the following description of a preferred embodiment.

SUMMARY OF THE INVENTION

In accordance with the present invention, there is described and claimed a method for designing and validating, including testing, a portable protective air gap (PPAG) device including a first and second electrode, suitable for use at a worksite of a particular utility company. The worksite includes a tower support structure, at electrical ground potential, for supporting a multiphase, electrical voltage transmission line network used to transmit a known, power frequency system, multiphase voltage of known nominal system voltage, phase to phase, $kV_{rms,\ ph\text{-}ph}$. The transmission line network includes a respective electrical transmission line for at least each phase of the multiphase voltage, each of said transmission lines suspended from a respective segment of the tower support structure by an insulating electrode. The tower support structure has a unique shape based in part on the magnitude of the power frequency system voltage transmitted on the lines of the transmission line network. The PPAG device must be suitable in design to protect a worker positioned at the worksite on the tower support structure, and engaged in live-line maintenance, against the possibility of voltage sparkover across one or more of a plurality of air gaps between the worker and each respective electrical transmission line. The method comprising the steps of:

(a) establishing a set of performance criteria to consider in the design and testing effort including one or more of at least the following,
  (i) the PPAG should not sparkover under nominal maximum, AC system voltage,
  (ii) setting a withstand p.u. factor of the PPAG at a predetermined value,
  (iii) setting a breakdown p.u. factor of the PPAG at a predetermined value, and,
  (iv) deciding on an expected location for the PPAG, i.e., in the tower support structure or not;
(b) identifying a set of important parameters that affect the sparkover voltage for a specific air gap of the PPAG design, including,
  (i) the geometry of the first and second electrode,
  (ii) the shape of an applied voltage to be used during the testing phase of the PPAG design,
  (iii) the polarity of the applied voltage,
  (iv) the proximity of the air gap of the PPAG to other objects, including the tower support structure,
  (v) atmospheric conditions, and,
  (vi) the material of the first and second electrodes;
(c) performing a series of determinations and calculations, including,
  (i) determining the nominal system kilovoltage rating, phase to phase, $kV_{rms\ ph\text{-}ph}$, of the power frequency system,
  (ii) calculating a nominal maximum system voltage, phase to phase, $kV_{rms\ ph\text{-}ph}$, by multiplying the value in step (c)(i) by a factor based on the known or anticipated variation in voltage from the nominal system voltage in step (c)(i), for example, 1.05,
  (iii) calculating a phase-ground, nominal maximum system voltage, $kV_{rms\ ph\text{-}g}$, (max), by dividing the result of step (c)(ii), by $\sqrt{3}$,
  (iv) calculating a peak, phase-ground, nominal maximum system voltage, $kV_{peak,\ ph\text{-}gr}$, by multiplying the result of step (c)(iii), by $\sqrt{2}$,
  (v) stating the withstand p.u. factor, as established by the utility,
  (vi) calculating a required withstand voltage by multiplying the result of step (c)
  (iv) by the p.u. factor stated in step (c)(v),
  (vii) stating an acceptable value of $\sigma$, where $\sigma$ is the standard deviation,
  (viii) calculating a $U_{50}$ value from the required withstand voltage value by dividing the result of step (c)(vi) by the factor $(1-3\times\sigma)$, where $U_{50}$ is a peak voltage value where there is a 50% probability of sparkover,
  (ix) for later use, calculating a first breakdown voltage value, from the withstand voltage value by multiplying step (c)(viii) by the factor $(1+3\times\sigma)$,
  (x) for later use, stating the breakdown p.u. factor provided in the performance criteria,
  (xi) for later use, calculating a second breakdown voltage based on the breakdown p.u. factor, by multiplying the result of step (c)(viii) by step (c)(x),
  (xii) stating a first material factor for the material used to form the first and second electrode,
  (xiii) stating a second material factor based on the shape of the first and second electrode,
  (xiv) stating a location factor based on the expected location of the PPAG,
  (xv) calculating a first corrected value for $U_{50}$ by multiplying step (c)(viii) by each of the above factors, i.e., steps (c)(xii) through (c)(xiv),
  (xvi) using FIG. 14, obtain a first D value for the gap distance between the first and second electrode from the test data for horizontal rod-rod gaps,
  (xvii) using FIG. 15 obtain a second D value for the gap distance between the first and second electrode from the test data for vertical rod-rod gaps,
  (xviii) determining an air saturation factor, a, from graphs available in, at least, IEEE Std 516-1995, "IEEE Guide for Maintenance Methods on Energized Power Lines",
  (xix) using the formula, $D=(C_1 \times C_2+a) \times (p.u.$ as stated in step $(c)(v)) \times V_{rms,ph\text{-}g}$, to calculate a third D value for the gap distance between the first and second electrode, where $C_1$ and $C_2$ are as identified in, at least, IEEE Std 516-1995, "IEEE Guide for Maintenance Methods on Energized Power Lines",
  (xx) stating a gap factor, k, to establish a further correction of the value for $U_{50}$ determined in step (c)(xv), such that the difference in performance of rod-rod and rod-plane gaps is compensated for, (xxi) using the formula, $U_{50}/k=1080 \times \ln(0.46 \times D+1)$, where $U_{50}$ is the first corrected value for $U_{50}$ from step (c)(xv), calculate a fourth value of D for the gap distance between the first and second electrode, and, (xxii) using the formula, $U_{50}/k=450 \times D+20$, where $U_{50}$ is the first corrected value for $U_{50}$ from step (c)(xv), calculate a fifth value of D for the gap distance between the first and second electrode.

The method includes the further steps of:

(d) reviewing detailed construction drawings of the tower support structure supporting the line voltages in which the PPAG is to be deployed, such that, at least, the shortest phase-structure distances are determined;

(e) building a prototype PPAG, $PPAG_{proto}$, having an initial gap distance, $D_{initial}$, for the gap distance between the first and second electrode, the initial gap distance selected based in part on a review of the range of D values determined in steps (c)(xvi) through (c)(xxii) above; and, (f) installing the $PPAG_{proto}$ built in step (e), on or off, depending on the choice made in step (a)(iv) above, a full-scale worksite mockup, the mockup including, at least, the tower support structure supporting at least one phase of the multiphase, electrical voltage transmission line network of known nominal system voltage, and including the shortest phase-structure distance determined in step (d).

The method includes the further steps of:

(g) powering the at least one phase of the multiphase, electrical voltage transmission line network of known nominal system voltage, with the known nominal system voltage;

(h) testing the $PPAG_{proto}$ for its respective breakdown voltage by superimposing a switching impulse voltage source upon the at least one phase, the switching impulse voltage source capable of producing a plurality of peak impulse voltages of known, varying magnitude in combination with a plurality of differing front times of known varying magnitude, the plurality of peak impulse voltages, when added to the calculated peak, phase-ground, nominal maximum system voltage, $kV_{peak,\ ph-gr}$, determined in step (c)(iv), equaling a respective total peak voltage of respective peak magnitude, the respective total peak voltage spanning between values below and above the $U_{50}$ value determined in step (c)(xv);

(i) ascertaining the actual breakdown voltage of the $PPAG_{proto}$ under test in step (h);

(j) adjusting the gap distance, $D_{initial}$, if required, and repeating steps (h) and (j), and again, if required, and so forth, until the adjusted gap distance results in an actual breakdown voltage that is acceptably close proximity to the $U_{50}$ value in step (c)(xv).

In a typical application, the withstand and breakdown p.u. factors would be 1.3 and 1.7, respectively; and, σ would be 0.05. The first and second electrodes are each made from ½", round steel rods and include a hemispherical tip. The electrodes are axially aligned with their tips disposed facing each other at the determined gap distance. The first and second material factors in the calculation steps above, for this material and rod shape, are each 1.0.

Where the PPAG is to be located in the tower structure, the location factor noted above is 1.1.

The testing procedures employed follow the industry, up-and-down method to determine the various $U_{50}$ values. The testing is corrected for atmospheric conditions, again according to industry accepted standards.

PPAG designs for three nominal system voltages, 115/138 kV, 230 kV and 345 kV are disclosed. These were designed and validated according to the test procedure above. The actual gap distances for each system voltage fell in the following, respective ranges: 9.5" to 12.5"; 17" to 21"; and 29" to 33". Recommended gap distances in each range are arrived at through successive gap adjustment and testing.

The invention further claims a universal PPAG device which provides for one of the electrodes to be removably replaceable with a different respective electrode depending on the particular system voltage. A particular electrode has a respective length such that the resulting gap with the second electrode falls at the recommended gap distance for that system voltage, tower structure, etc.

BRIEF DESCRIPTON OF THE DRAWINGS

FIG. 7 depicts in table form various Haefely, impulse generator configurations as used in the developmental work leading to the principals of the present invention.

FIG. 8 depicts in table form, various values of resistors necessary to generate certain "front times" for the impulse voltages used in the developmental work leading to the principles of the present invention.

FIG. 9 summarizes various test configurations for various transmission line voltages and tower configurations which were evaluated in the developmental work leading to the principles of the present invention.

Figure 10:
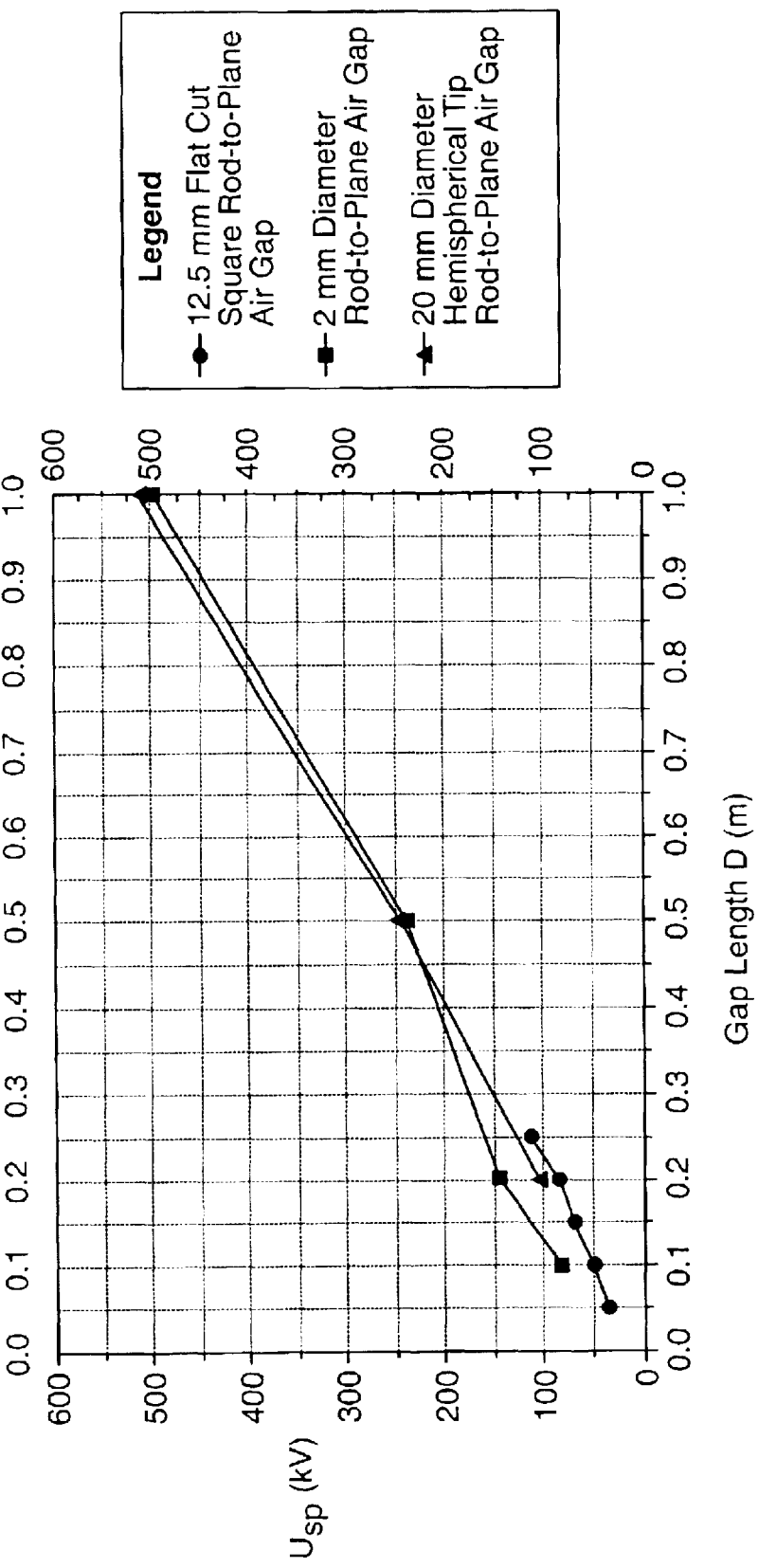

FIG. 10 depicts in graph form the plot of positive DC sparkover voltage for the air gap formed between a rod and a plane, versus gap length, for 3 rod-end shapes.

FIGS. 11, 12 and 13 summarize the gap distance determinations for various calculations made in accordance with the principles of the present invention, for three different transmission voltage levels.

Figure 14:
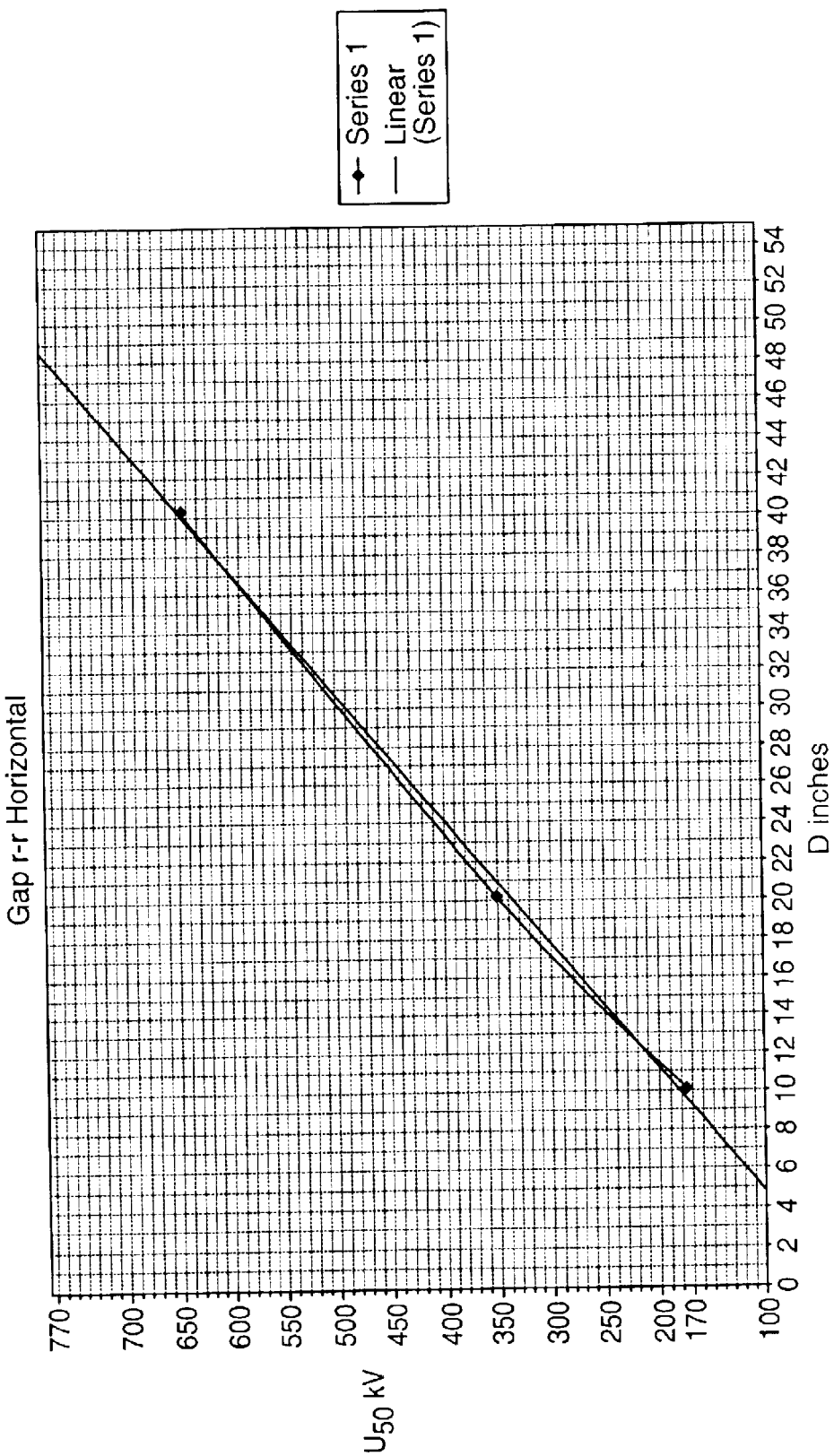

FIG. 14 is a plot of the positive switching impulse sparkover voltage, $U_{50}$, in kV, for various horizontal, rod-rod air gap distances.

Figure 15:
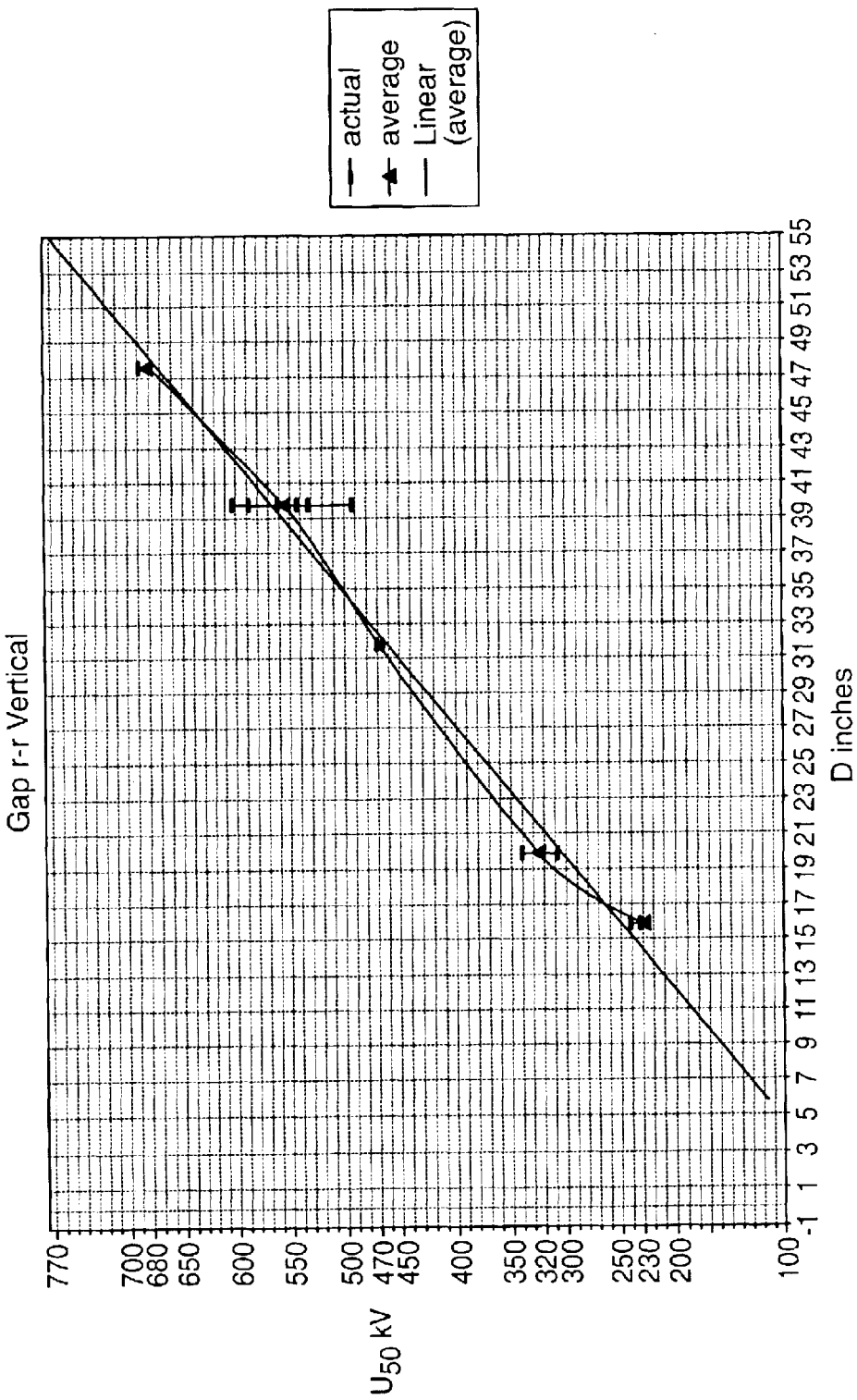

FIG. 15 is a plot of positive switching impulse sparkover voltage, $U_{50}$, in kV, for various vertical rod-rod air gap distances.

FIG. 16 shows in tabular form, examples of the effect of various electrode geometries on the sparkover voltage, $U_s$, for various air gaps energized with AC voltage.

FIG. 17 displays examples of sparkover voltages for the rod-to-plane and the hoop-to-plane air gap for various types of applied voltages.

FIG. 18 depicts the effects of various switching impulse wave shapes on $U_{50}$, for a vertical rod-to-plane air gap of 0.5 meters.

FIG. 19 shows the effects of polarity of sparkover voltage on an asymmetrical, vertical rod-to-plane air gap of 0.5 meters.

Figure 20:
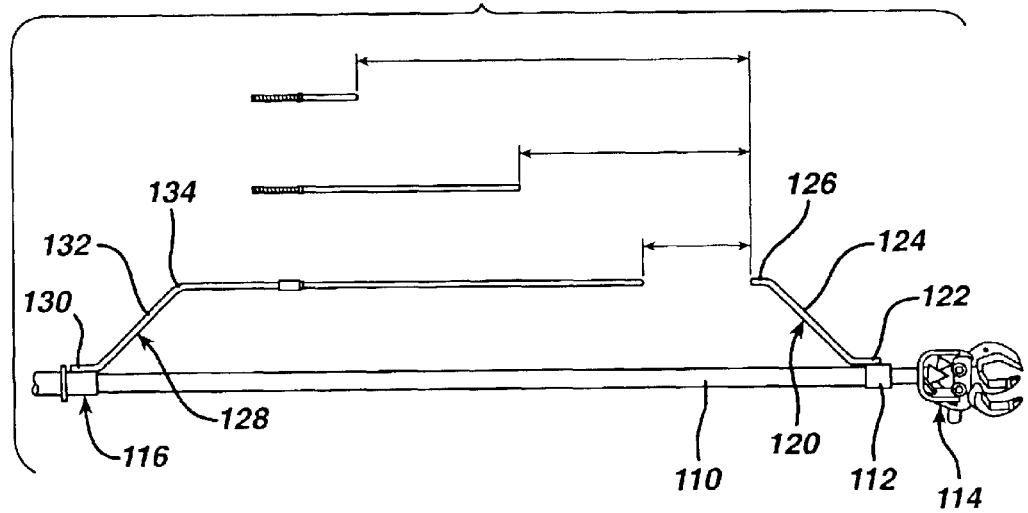
Figure 21:
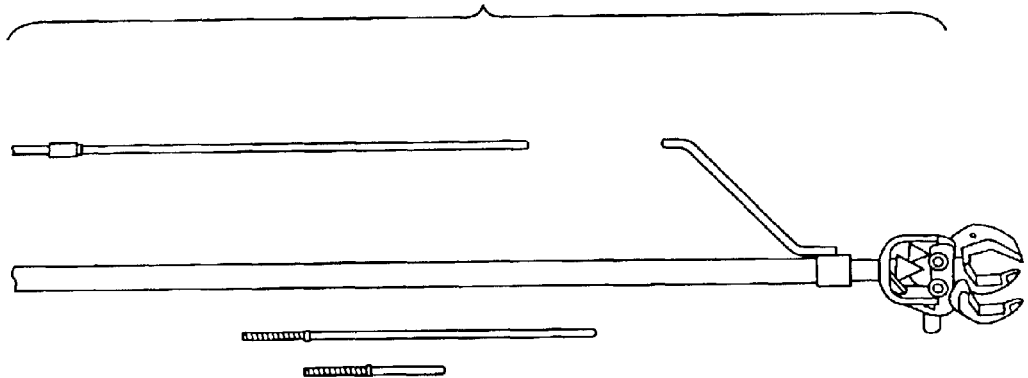

FIGS. 20 and 21 depict the rod-rod PPAG apparatus produced in accordance with the methodology of the present invention for certain transmission line voltage configurations.

FIGS. 22a and 22b show in schematic and tabular form the design details and determinations for various transmission line voltage levels, of the PPAG tool designed in accordance with the principles of the present invention.

Figure 23:
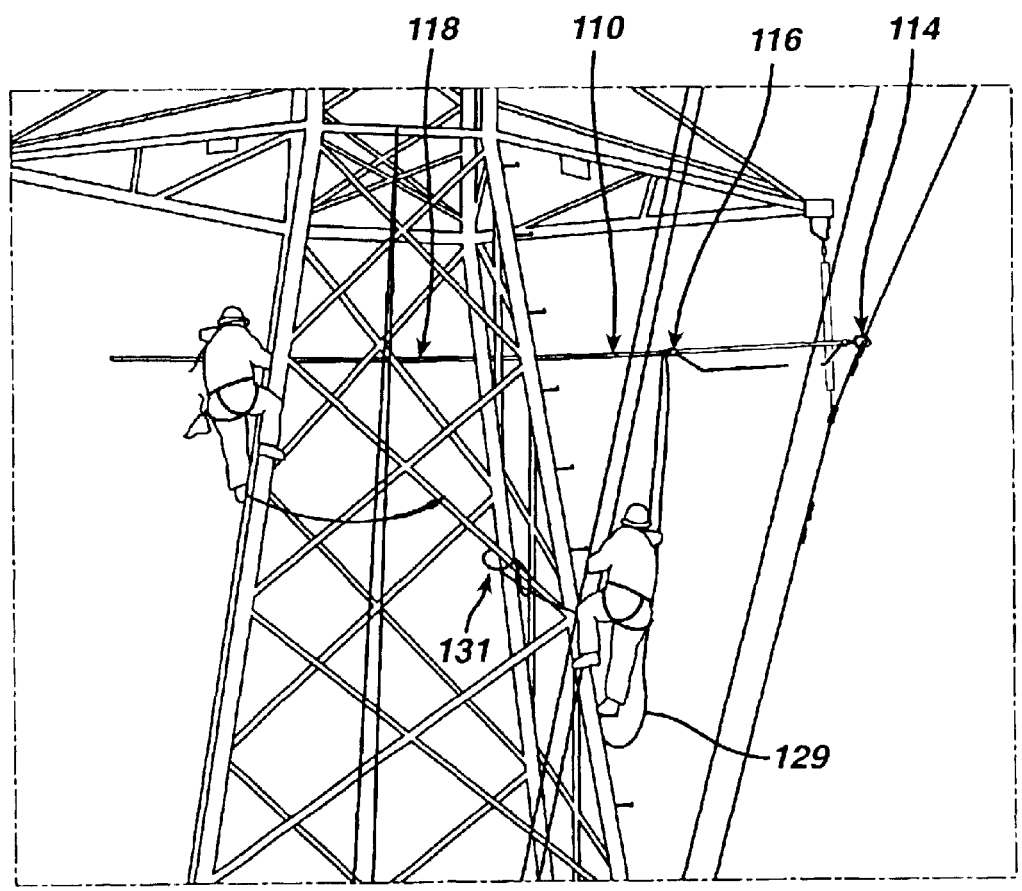

FIG. 23 depicts in perspective view, the application of a PPAG apparatus as designed in accordance with the principles of the present invention as used in the field.

DESCRIPTION OF THE PREFERRED EMBODIMENT

Sparkover

Figure 2:
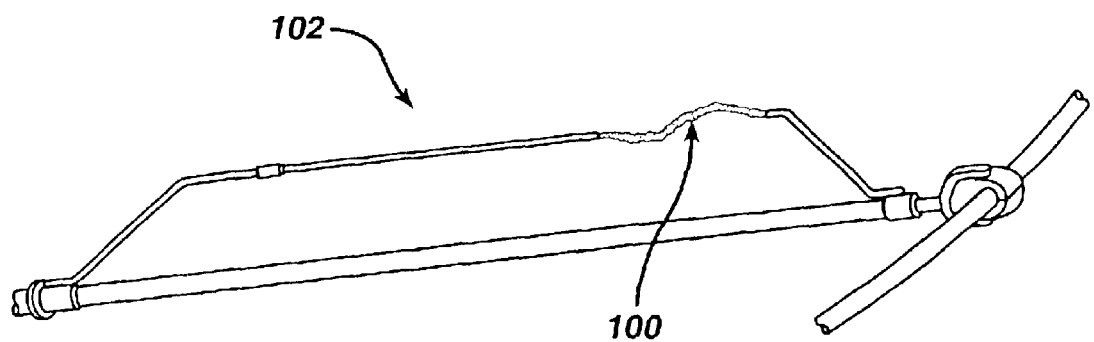
FIG. 2 illustrates the sparkover voltage condition as occurs as one embodiment of the PPAG designed in accordance with the principles of the present invention.

A PPAG sparks over at a predetermined voltage level, which limits the overvoltage and prevents possible sparkover at the worksite. FIG. 2 shows the sparkover, 100, of a 138 kV PPAG, 102, as designed by the methodology set forth herein, in a high-voltage test laboratory. Sparkover is preceded by corona, which appears as a very faint bluish glow. Both corona and sparkover have a somewhat random character, i.e., the corona onset voltage and the sparkover voltage can vary from one test to the next by a small amount. In addition, both are dependent on atmospheric conditions.

Probability of Sparkover

Because of the somewhat random character of sparkover, the exact value of the sparkover voltage cannot be determined by a single test. Instead, many tests have to be performed to determine the probability of sparkover, i.e., the probability that sparkover will occur at a specific voltage value. For example, if one applies 100 switching impulses with a peak value of 150 kV to a 230 kV PPAG, then the PPAG will withstand practically all 100 impulses, i.e., it will not spark over. We can say that the probability of sparkover of the 230 kV PPAG is zero, or 0%, for any switching impulse with a peak of 150 kV.

If one applies 100 impulses to a 230 kV PPAG, and each impulse has a peak value of 550 kV, the PPAG will break down (it will spark over) on every impulse. We can then say that the probability of sparkover of the 230 kV PPAG is 1 (or 100%) for switching impulses with a peak value of 550 kV.

If one applies 100 impulses to the 230 kV PPAG, and each impulse has a peak value of 275 kV, the PPAG will spark over about five times out of 100 (as an example) and will withstand the impulse 95 times. Then, the probability of sparkover is 5%, and the probability of "withstand" is 95%. And so on as follows:

applying an impulse of 290 kV gives a probability of sparkover of 25% or probability of withstand of 75%;

applying an impulse of 295 kV gives a probability of sparkover of 37% or probability of withstand of 63%;

applying an impulse of 300 kV gives a probability of sparkover of 50% or probability of withstand of 50%;

applying an impulse of 305 kV gives a probability of sparkover of 63% or probability of withstand of 37%;

applying an impulse of 310 kV gives a probability of sparkover of 75% or probability of withstand of 25%; and, applying an impulse of 320 kV gives a probability of sparkover of 91% or probability of withstand of 9%.

This is called the "Cumulative Probability of Sparkover"; or, the complement, the "Cumulative Probability of Withstand." The cumulative probability of withstand is 1 minus cumulative probability of sparkover. Or, in %, the cumulative probability of withstand is 100% minus the cumulative probability (%) of sparkover.

Figure 3:
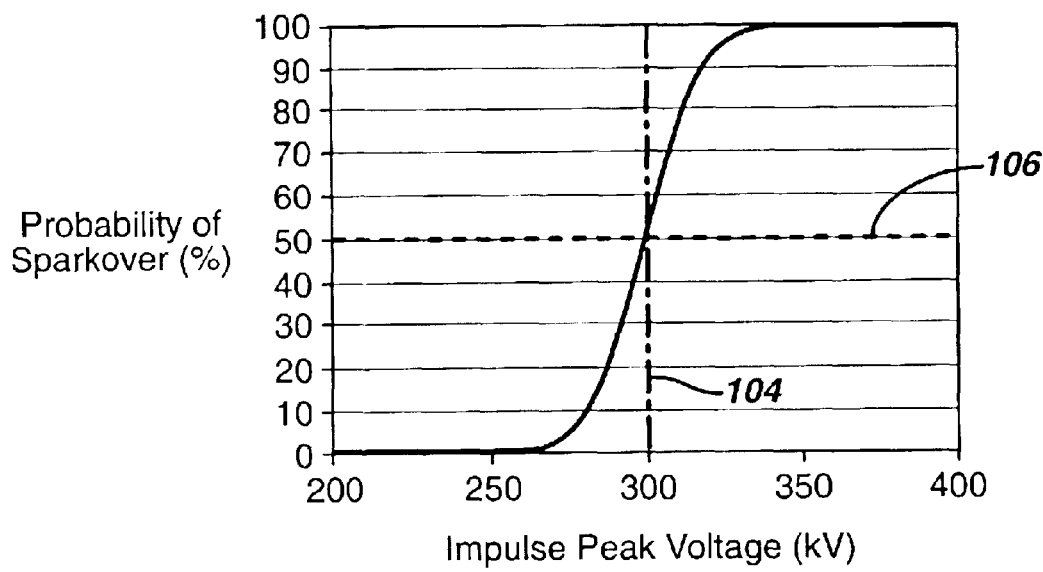
FIG. 3 depicts in graph form, the probability of a sparkover for 230 kV PPAG design in accordance with the principles of the present invention for a range of impulse peak voltages.

The cumulative probability of sparkover is plotted in FIG. 3 vs. the impulse peak voltage. The cumulative probability of withstand is plotted in FIG. 4 vs. the impulse peak voltage.

Of course, similar comments apply to all air gaps, including the conductor-structure air gap and the worker-structure air gap for bare-handing.

Meaning of $U_{50}$

Figure 4:
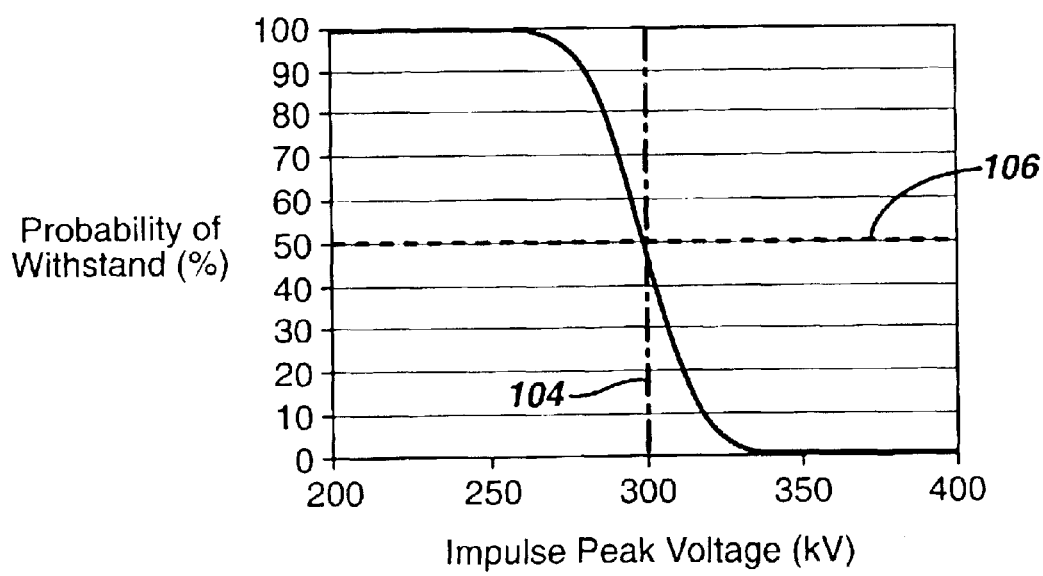
FIG. 4 is a plot of the probability of worksite, withstand voltage occurring for a 230 kV PPAG of the present invention for a range of impulse peak voltages.

From the above discussion, it is clear that we can find a switching impulse with a peak value that will result in a 50% probability of sparkover (and 50% probability of withstand). This is called the "50% probability of sparkover voltage" (or the "50% probability of withstand voltage") and is usually designated as $U_{50}$. $U_{50}$, 104 in FIGS. 3 and 4, is the voltage level that has a 50—50 chance of causing a withstand and a sparkover, i.e., 50% probability of withstand and 50% probability of sparkover. Applying an impulse with a peak voltage of $U_{50}$ or less gives a probability of withstand of 50% or more and a probability of sparkover of 50% or less. Applying an impulse with a peak value of $U_{50}$ or more gives a probability of sparkover of 50% or more or probability of withstand of 50% or less. $U_{50}$ is the "critical" value, which used to be called the Critical Flashover Voltage (CFO), but use of this name is now deprecated.

For the example shown, $U_{50}$=300 kV and is indicated by the vertical line, 104, at 50% probability in FIGS. 3 and 4. The region to the left of $U_{50}$ is where "mostly withstands," are found, i.e., impulses with peak values less than $U_{50}$ result in more withstands than sparkovers. Conversely, in the region to the right of $U_{50}$ is where "mostly sparkovers," occur, i.e., impulses with peak values greater than $U_{50}$ result in more sparkovers than withstands.

The increase in the probability of sparkover grows more and more until we get to the 50% probability level in FIG. 3. From then on, the increase in the probability of sparkover tapers off as we go further up the curve to the right of the 50% point.

Meaning of $\sigma$

Figure 5:
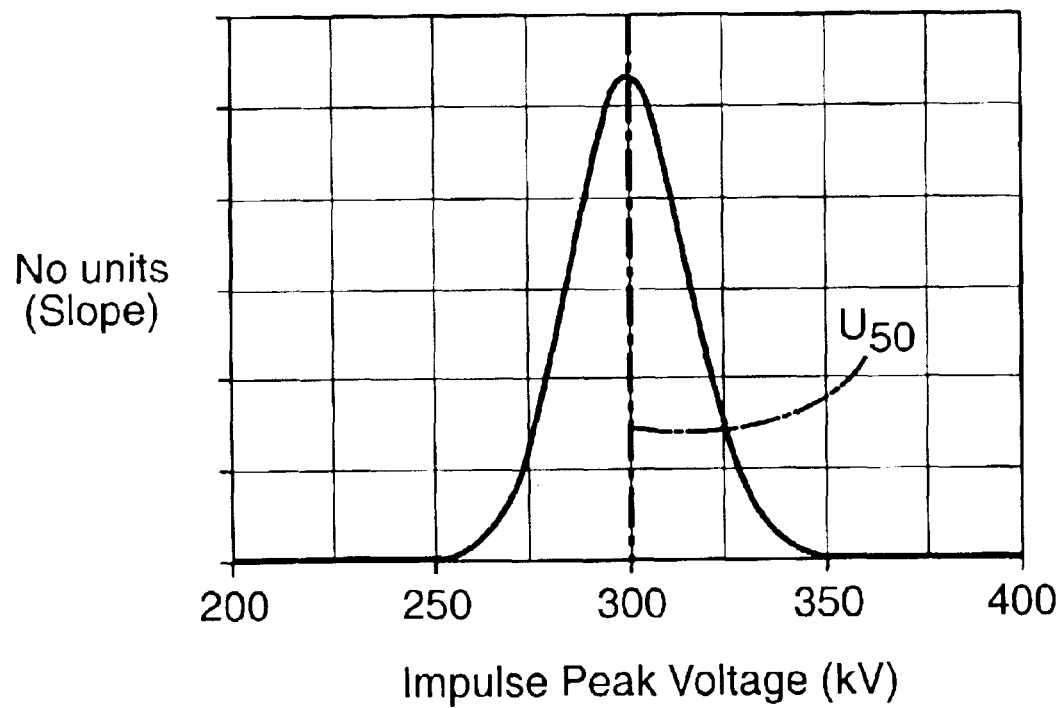
FIG. 5 depicts in graph form, the slope of a cumulative probability curve versus impulse peak voltage for a 230 kV PPAG design in accordance with the principles of the present invention.

The cumulative probability curves in FIGS. 3 and 4 are very shallow at the low and the high ends and have the highest steepness at $U_{50}$. The slope, or steepness, of the cumulative probability curve vs. voltage can be drawn as shown in FIG. 5. The slope is zero at both ends and greatest (maximum) near $U_{50}$. The curve is also symmetric and looks like a bell. Hence, it is often called the "bell curve." The measure of the width of the "bell curve" is the standard deviation, $\sigma$. For the example in FIGS. 3 and 4, $\sigma$=5% of $U_{50}$, or $\sigma$=15 kV for $U_{50}$ of 300 kV. The typical value of $\sigma$ is 5% of $U_{50}$.

The steeper the cumulative probability curve, the smaller the value of $\sigma$ and the narrower the bell curve. Conversely, if the cumulative probability curve is shallower, then the value of σ will be larger and the bell curve will be wider.

The value of σ also indicates how PPAG performance transitions from the "mostly withstands" region (to the left of $U_{50}$) to the "mostly sparkovers" region (to the right of $U_{50}$). For small σ the PPAG transitions from withstands to sparkovers over a narrow voltage range, i.e., a small increase in the peak voltage value will cause the PPAG to spark over. For large σ the PPAG transitions from withstands to sparkovers over a wide voltage range, i.e., a large increase in the peak voltage value is needed to cause the PPAG to spark over. In this case (large σ), the performance of the PPAG is uncertain around $U_{50}$, i.e., it is not possible to predict whether the PPAG will spark over or not.

Figure 1:
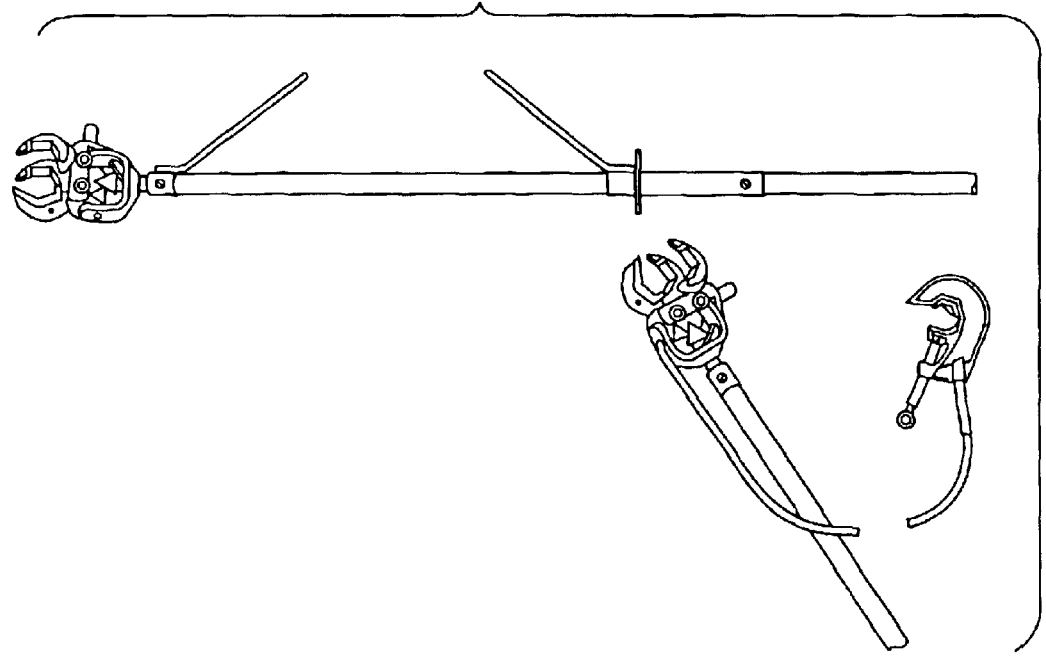
FIG. 1 depicts in schematic form, the prior art design of a horn shaped PPAG for use on live, 500 kV transmission lines.

For this reason, it is desirable to use gaps with very small σ. In practice, a sphere gap has a very small σ value (about 2–3%). However, as noted above, spheres are difficult to handle and can be damaged easily in service. Spheres are usually hollow inside and are made from two spun halves welded or soldered together. Hollow spheres can be damaged (dented) easily. Thick-shell or nearly solid spheres are more resistant to denting, but they are heavy and require strong supports. Once the sphere is damaged, the σ increases and can approach that of a rod-rod gap. When this happens, the performance advantages of spheres are irrecoverably lost. Therefore, for practical reasons, it is better to use a rod-rod PPAG since its performance will not deteriorate in service. The typical value of σ for the PPAG shown in FIG. 1 is about 5%. This is also the value used in most Minimum Approach Distance (MAD) calculations for live work.

How $U_{50}$ Depends on Gap Distance

The $U_{50}$ value of a PPAG relates to the gap distance in a complicated way. In general, however, $U_{50}$ is larger for longer air gaps and smaller for shorter gaps. The dependence of $U_{50}$ on gap distance as a practical matter has to be determined by tests. Since the structure has an effect on the $U_{50}$ value, PPAGs must be tested on structures simulated to behave like those on which they will be used.

How the PPAG Protects the Worksite

The probability-of-sparkover concept discussed above also applies to the worksite, which has its own $U_{50}$ and σ values, ($U_{50worksite}$, $\sigma_{worksite}$). If a switching impulse, arriving at the worksite on a structure as the result of switching operations on the line, has a sufficiently high peak value, a sparkover will occur on the structure. The structure clearances are designed to be large enough so that the probability of sparkover is very, very low, i.e., $U_{50worksite}$ is very high. However, when the worksite contains defective insulators, live working tools and workers, the resulting $U_{50worksite\ and\ tools}$ can be significantly smaller, i.e., $U_{50worksite\ and\ tools} < U_{50worksite}$ In that case, the probability of sparkover for an incoming impulse can become significant and not acceptable for safe live work.

The PPAG is selected to have its $U_{50PPAG}$ significantly lower then the $U_{50worksite\ and\ tools}$ of the worksite with defective insulators, tools and workers: i.e., $U_{50PPAG} < U_{50worksite\ and\ tools}$. In this case, the PPAG sparks over when an impulse arrives at the structure adjacent to the worksite, where the PPAG is typically installed, and limits the overvoltage at the worksite. The coordination between $U_{50PPAG}$ and $U_{50worksite\ and\ tools}$ is done by a company's engineering department, which makes sure that the worksite is safe for live work.

Reduction of Overvoltage at the Worksite

In effect, the PPAG limits (reduces) the overvoltage that could occur at the worksite. For example, the typical maximum switching overvoltage experienced on a 230 kV line is 3 p.u., where the voltage corresponding to 1 p.u. is determined by the following formula: $V(1\ p.u.)_{rms}=(V_{nom}\times 1.05) \times \sqrt{2}/\sqrt{3}$. This calculates to a peak value of 594 kV, i.e. 3V (1 p.u.), or simply 3 p.u. Tests on a 230 kV steel lattice tower with a vertical phase configuration, determined the $U_{50tower}$ to be 853 kV. Hence, the probability of sparkover of the tower is practically nil even if the maximum (3 p.u.) switching impulse occurs at the tower.

However, if the tools and workers (represented in tests typically by metal mannequins) are placed on the tower to simulate typical live work, then tests conducted have revealed a lowering of $U_{50\ worksite}$, now $U_{50worksite\ with\ tools}$, to 659 kV. This $U_{50worksite\ with\ tools}$ value is only 65 kV higher than the 3 p.u. impulse, and the probability of sparkover is about 2.4%. While the likelihood that such a high switching impulse would occur at the worksite at the exact time live work is being performed is quite low, and therefore the corresponding risk to the workers is very low, it is still prudent to further reduce the risk.

When the PPAG designed apparatus of the present invention for a nominal 230 kV application is installed (again, on the adjacent structure) for the duration of work, the $U_{50PPAG}$ of the PPAG, with tools and worker at the worksite, is $U_{50PPAG}=291$ kV. That means that the PPAG will operate when a 594 kV (i.e., 3 p.u.) switching impulse arrives at the worksite, and the overvoltage at the worksite will be limited by the PPAG to a safe level. In fact, when the PPAG operates, the overvoltage is immediately reduced to zero, the line protection system detects a line-to-ground fault, and the line is tripped. Blocking a reclosure prevents re-energization of the line.

Figure 6:
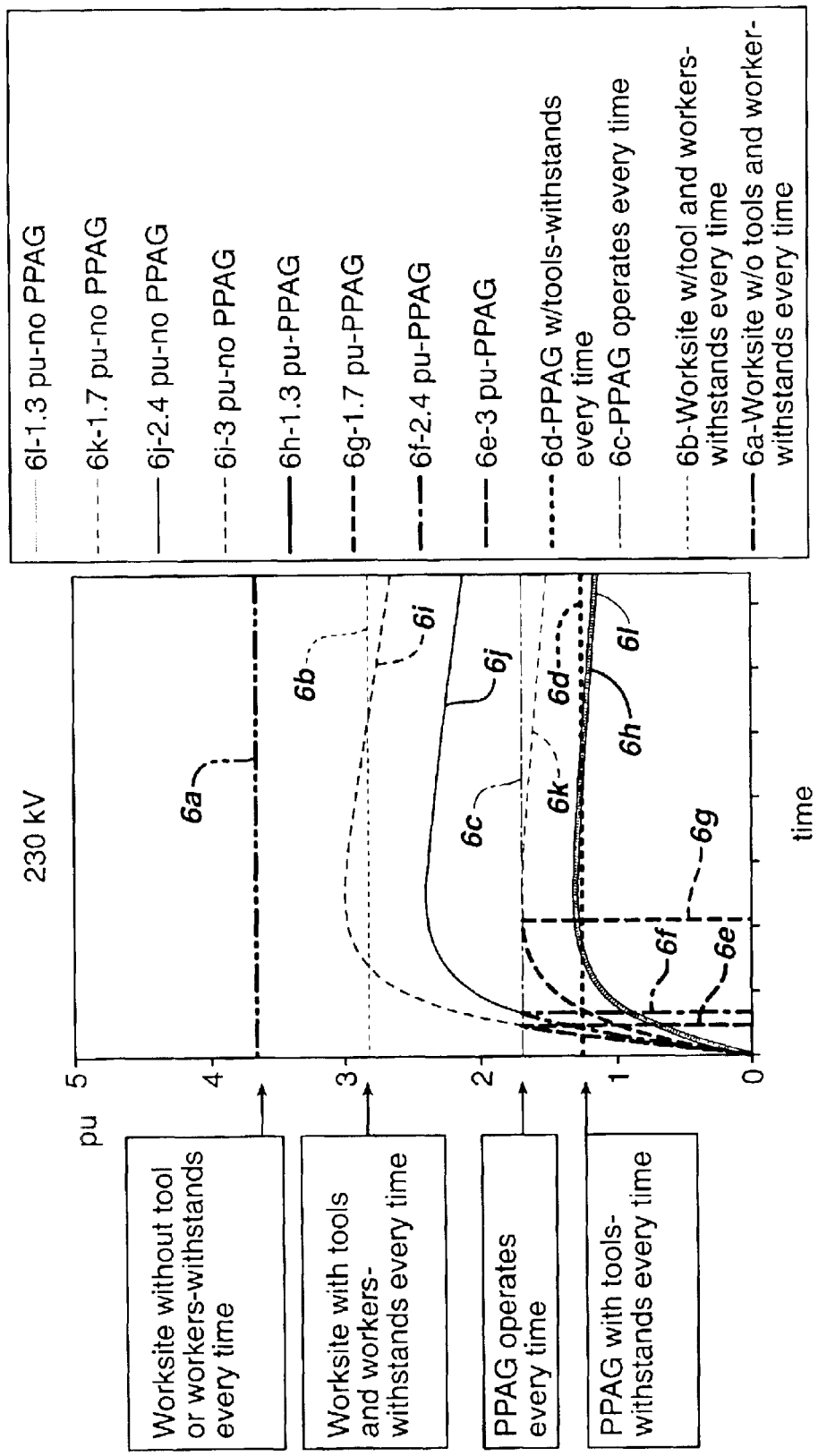
FIG. 6 is a graph depicting several switching impulse to line voltage relationships as expressed in p.u. (per unit) and corresponding sparkover and withstand responses for various worksite conditions with and without the PPAG device designed in accordance with the principles of the present invention being in place.

Calculation of the probability of sparkover of the PPAG for a 594 kV (i.e., 3 pu) switching impulse is complicated and is not included here. FIG. 6 shows graphically several switching impulses with various peak values for a 230 kV line, and the responses (sparkover/withstand) of the PPAG, the worksite and the structure. This illustrates the coordination of the PPAG for live working on a 230 kV line.

How the PPAG Allows Reduced Minimum Approach Distance (MAD)

The Minimum Approach Distance for live work is related to the maximum expected overvoltage at the worksite. Without the PPAG the maximum overvoltage expected at the worksite on the 230 kV line is 594 kV (3 p.u.). The MAD must be selected appropriately for this level (See IEEE Std. 516). With the PPAG installed for live work, the maximum expected overvoltage is determined by the PPAG, and it is significantly lower than 594 kV, as discussed above. Hence, the required MAD is also significantly reduced.

The Test Setup and Equipment

Selection of Structures for Testing

Experience has shown that the application of PPAGs to various line systems should not be done without prior rigorous testing on the specific structures on which they will be deployed. Several laboratory test programs have been conducted by various research organizations over the years to develop PPAGs for voltage levels other than the 500 kV system. None of these have led to practical gap designs that are suitable for routine use in live work (see discussion above). A first order of business is to review detailed construction drawings of various structures supporting the line voltages for which the PPAGs are under consideration.

The drawings are analyzed and the focus is on those with the shortest phase-structure distances. The structures selected made for the various systems under consideration were as follows:

115/138 kV Structure

The Type "K" (unique to the assignee) double-circuit steel lattice structure was selected.

230 kV Structures

Type "A" (unique designation of the assignee) horizontal steel lattice, shortest phase-to-structure distance 11 ft.-2 in., I-string, 16 unit string.

Type "S-5-2N" (unique designation of the assignee) vertical steel lattice, shortest phase-to-structure distance 8 ft.-9 in., V-string, 16 units.

Type "S-6°-2" (unique designation of the assignee) vertical steel pole, shortest phase-to-structure distance 9 ft.-6 in., I-string, 16 units.

345 kV Structures Selected for Testing

Double-circuit horizontal, lattice tower, Cleveland Electric Illuminating Perry-Macedonia 345 kV line, structure 3L6, V string (18 bells), minimum distance 8-ft. (straight up from yoke plate). Tests concentrated on the lower window.

Double-circuit vertical, lattice tower, Con Edison Aqueduct 345 kV line, structure 3L11, V string (18 bells), minimum distance 8 ft. (straight up from yoke plate). Tests concentrated on the middle phase.

Mockups of the Structures Selected for Testing

After the structures are identified, mockups of the structures selected for tests are made, making sure that the important characteristics of the structures, such as minimum distances and electrodes shapes, are properly represented. Tests are performed not just on the structures, alone, but also on various combinations of tools and workers at the worksite on the structures. These tests are performed both without the PPAG and with the PPAG installed on the structure. Normally, again, in actual use, the PPAG would be installed on an adjacent structure.

Setup for Testing of the PPAG in Free Space

To provide a benchmark for determining the effect of the structure on the sparkover performance of the PPAG, tests on the PPAG are performed far away from nearby objects. For example, the PPAG is suspended horizontally between the phases of the long line at the test facility. The phase separation in this case was about 15.5 m (50 ft.). The PPAG was approximately 18 m (60 ft.) above ground and approximately 15.5 m (50 ft.) from the nearest energized or grounded equipment or structure. In the test performed, one phase (the east phase) was energized while the other phase (the center phase) was grounded through a 20 kΩ resistor. A braided cable was used as the connection between the grounded rod electrode of the PPAG and the grounded phase of the test line. The cable was taped in place along the fiberglass supporting rod of the PPAG.

Test Equipment

Switching impulse tests were performed using the following equipment:

an outdoor Haefely 5600 kV impulse generator manufactured by the Emil Hafely Corporation, of Basel, Switzerland, with all controls, monitoring circuitry, and interlocks;

a compensated (Zaengl) resistive-capacitive voltage divider and measuring system generator manufactured by the Hipotronics Corporation, of Brewster, N.Y.;

a high-speed data acquisition and storage system, as for example, the control console and impulse data acquisition system available through the Hipotronics Corporation of Brewster, N.Y.;

commercially available instrumentation for monitoring and recording weather conditions; and, digital cameras and video equipment.

The impulse generator employed is an outdoor unit rated at 5600 kV (5.6 MV), 280 kJ. It is a Marx-type bipolar-charging circuit that consists of 56 capacitors, each rated at 100 kV, 1 $\mu$F.

The capacitors are charged individually (in parallel) by the charging circuit and then rapidly reconnected in series by firing the sphere gaps installed between the generator stages inside the generator. The generator contains internal discharging (or tail) resistors $R_t$, internal charging (or front) resistors, $R_f$, and external resistors, $R_{external}$ that are used to control the shape of the output voltage impulse wave. The outdoor capacitive (for switching impulse tests) or compensated resistive/capacitive (for lightning and switching impulse tests) voltage dividers serve to provide reduced voltage signals to the measuring system. The compensated resistive-capacitive divider was used for this project. They also contribute to the control of the rise time (the front time, or the time to crest, $t_{cr}$) of the output voltage impulse. The external resistors can be varied to achieve the desired front portion of the output voltage impulse. The measuring and the data acquisition system conforms to accepted industry standards and were used to record and store each applied voltage impulse.

The generator configurations used in this project are summarized in FIG. 7. Tests were performed with various nominal switching impulse wave shapes (front times): 55, 105, 140 180 and 210 $\mu$s. The front times were controlled by external resistors and also by employing additional front capacitance (the capacitance of the center phase of the long line at the Center; this capacitance value is about 6.2 nF per phase). The external front resistors used to generate these wave shapes are summarized in FIG. 8 which also indicates whether or not the center-phase capacitance was used. A 20 kΩ resistor was connected between the structure and the ground to reduce noise and to protect the generator capacitors during sparkovers. This ground resistor had no effect on the spark over voltage.

Impulse tests on structures were performed by applying the impulse to one phase at a time. In most tests, the other phases were connected to the structure (i.e., to ground) using thin copper wire. Electrically, this is the worst-case situation for the de-energized phases. In some tests, the other phases were left electrically floating.

Switching impulse tests on structures were performed with and without the PPAG installed, with various gap distances, and with various impulse wave shapes. Switching impulse tests were also performed on the PPAGs in free space with various gap distances and with various impulse wave shapes. FIG. 9 summarizes the tested conditions. In addition, various work scenarios were tested, including tools and workers.

AC Tests

AC tests were performed to confirm that the PPAG will not spark over at normally expected ac voltages.

No sparkovers occurred during ac tests.

Calculation of the Air Gap Distance for PPAGS

Performance Criteria for the PPAG

A set of ground rules and performance criteria have to be established to frame the design and testing effort.

The following performance criteria control the development of the PPAGs:

the PPAG should not operate (spark over) under nominal maximum AC system operating conditions (Nominal Maximum AC voltage);

the withstand p.u. factor of the PPAG should be set by the the utility based on an anticipated comfort level for their workmen and the space the workman have on the tower support structure to do their maintenance(a lower p.u factor), measured against the utility's need to minimize de-energizations of the involved lines(a higher p.u. factor). A typical p.u. factor, might be on the order of 1.3;

the breakdown (sparkover) p.u. factor of the PPAG will be as set by the utility—a typical breakdown p.u. factor might be on the order of 1.7 (the PPAG should withstand every time (i.e., 100% withstand and 0% sparkover), if the surge appearing at the worksite is 1.3 p.u. or less, and the PPAG should spark over every time, if the surge is 1.7 p.u. or more (i.e., 0% withstand and 100% sparkover)); and, whether or not the PPAG is to be located in the tower support structure.

Factors that Affect Switching Impulse Sparkover Performance of Air Gaps

The important parameters affecting the switching impulse sparkover voltage for a given air gap of the PPAG design include:

the electrode geometry;

the shape of the applied voltage to be used during the testing phase;

the polarity of the applied voltage;

the proximity of the air gap to other objects, including, of course, the tower support structure;

the atmospheric conditions; and, to a lesser extent, the material of the electrodes.

Electrode Geometry

The base case used ½" round rods with hemispherical tips. There is very little information available on the effect of the tip shape on switching impulse performance of rod-rod gaps with gap sizes (D values) that might be effective for PPAGs used with 115/138, 230 and 345 kV transmission lines. However, there is evidence that, in general, the curve of $U_{50}$ versus D is non-linear and exhibits an unusual "bump" at small distance values. This is best shown from available data in FIG. 10, which is a plot of positive DC sparkover voltage of a rod-plane gap versus gap length for three rod end shapes.

In general, if the gap with ½" diameter rods with hemispherical tips is taken as reference, a gap with a 30° cone tip has a $U_{50}$ value that is about 10% lower. A similar trend is observed for flat cut rods. However, both the cone tips and the flat cut tips can be easily damaged in transport and use.

Therefore, ½" diameter round rods with hemispherical tips are the preferred.

Shape of Applied Voltage

The worst-case, i.e., the "critical" switching impulse wave shape, the result of testing, should be used for the tests.

Polarity of Applied Voltage

Positive polarity switching impulse results in lower $U_{50}$ than negative polarity, and was used for the tests.

Proximity of the PPAG to other Objects

This factor was found to be important in the case of compact 550 kV steel lattice structures. The $U_{50}$ value of the PPAG placed in the tower was found to be 10% lower that that of the same PPAG placed far away from grounded tower members. The Proximity or Location Factor for a tower placement therefore, is 1.1.

Atmospheric Conditions

This is very important factor. See below for a detailed discussion.

Electrode Material

There is very little information on the effect of electrode material on the switching impulse sparkover performance of air gaps. The base case uses a PPAG with steel rods for electrodes. Based on data for DC, brass tips would result in an increase of $U_{50}$ by about 1%. Aluminum rods are not recommended since aluminum is soft and may suffer damage during transport and use.

Outline of the Calculation Procedure

Five methods are used to obtain the gap distance, D:
(1) Available test data for horizontal rod-rod gaps (See FIG. 14);
(2) Available test data for vertical rod-rod gaps (See FIG. 15);
(3) The IEEE Std 516 calculation method (See below);
(4) The CRIEPI (acronym for Central Research Institute of Electric Power, located in Japan) formula for rod-plane gaps, with the appropriate gap factor (See below);
(5) The Lemke formula for rod-plane gaps, with the appropriate gap factor (See below).

The resulting values of D for each system voltage level are summarized in FIGS. 11, 12 and 13.

The range of gap distance values (minimum to maximum) in FIG. 11 is 14%, in FIG. 12 it is 15%, and in FIG. 13 it is 19%. Method 4 above (CRIEPI) gives the largest D values, while Method 1 (test data for horizontal rod-rod gap) gives the smallest D values. It should be noted that the CRIEPI method was developed for large air gaps and does not really apply to the gap ranges treated here. Method 3 (IEEE Std 516) also gives large D values since this method is based on withstand (not $U_{50}$). It is difficult to adjust this method to use $U_{50}$ as a basis.

Method 2 (test data for vertical rod-rod gap, where one electrode is grounded) is the closest geometry to that of the PPAG installed in a tower for live work, since one side of the PPAG is connected to the grounded tower while the other side is energized.

It is preferred, therefore, that the values provided by Method 2 be used as the starting point for the design of the PPAG.

Details of Calculations

The calculation steps are:
1. determine the nominal system kilovoltage rating, $kV_{rms, ph-ph}$;
2. calculate the Nominal Maximum System Voltage, $kV_{rms, ph-ph}$ by multiplying the value in step 1 by a prespecified factor unique to the particular utility, for example 1.05;
3. calculate the phase-ground Nominal Maximum System Voltage, $kV_{rms, ph-g}$(max), by dividing the result of step 2 by $\sqrt{3}$;
4. calculate the peak, phase-ground Nominal Maximum System Voltage, $kV_{peak, ph-g}$, by multiplying the result of step 3 by $\sqrt{2}$;
5. state the p.u. factor that shall always results in withstands, as established by the utility (for example, 1.3);

6. calculate the required withstand voltage by multiplying the result of step 4 by the p.u. factor stated in step 5;
7. state the accepted value of σ, the standard deviation (for example, 5% or 0.05);
8. calculate the $U_{50}$ value from the required withstand voltage value by dividing the result of step 6 by the factor (1−3×σ) (for example, by 0.85);
9. for later use, calculate a first breakdown voltage value, from the withstand voltage value by multiplying step 8 by 1.15, i.e., by the factor (1+3×σ);
10. for later use, state the p.u. factor provided in the performance criteria that always results in a breakdown (for example, 1.7);
11. for later use, calculate a second breakdown(sparkover) voltage based on p.u. factor provided as a performance criteria, by multiplying the result of step 8 by step 10;
12. calculate the ratio of step 9 to step 11. This indicates whether the PPAG breaks down (sparks over) at a switching impulse voltage higher (if the ratio is greater than 1) or lower (if the ratio is less than 1) than that specified as the "assured" level of breakdown, i.e. at the breakdown p.u., for example, of 1.7 (Although not a necessary step, i.e. it does not affect the testing stage, this calculation facilitates the post-testing analysis stage. The step is used to assess the performance of the PPAG against the requirements. The ratio of these voltages is compared to unity. Without this step, a comparison of the voltages would have to be made, which is less convenient, but still the final conclusion would be reached);
13. based on available data[A-1], state a first material factor for the electrode material—for example, it would be 1.0 for steel;
14. based on available data[A-1], state a second material factor for the shape of the electrode—for example, it would be 1.0 for ½" round rods with hemispherical tips;
15. state a location factor depending on where the PPAG is to be placed at the worksite—for example, if the PPAG is to be located in the tower, the location factor would be 1.1, based on available data for a 500 kV, PPAG (see above);
16. calculate a first corrected value for $U_{50}$ by multiplying step 8 by the above factors (steps 13 through 15);
17. use FIG. 14 to obtain a first D value for the gap distance between the first and second electrode, from the test data for horizontal rod-rod gaps (Method 1);
18. use FIG. 15 to obtain a second D value from the test data for vertical rod-rod gaps (Method 2);
19. use the graphs from available data, for example, as found in IEEE Std 516-1995 [A-2], to find the air saturation factor, a, for use in step 20 (for the specific evaluations involved herein, the "a" factor was assumed to be 0.0);
20. use Method 3, (IEEE Std 516 calculation, see below) to calculate a third D value;
21. state the Gap Factor, k, (see discussion hereinafter) to adjust the $U_{50}$ for the difference in performance of rod-rod and rod-plane gaps. Use the value, $U_{50}$/Gap Factor, in Methods 4 and 5 set out hereinafter;
22. use Method 4 (the CRIEPI formula, see below) to calculate a fourth D value;
23. use Method 5 (the Lemke formula, see below) to calculate a fifth D value.

The IEEE Std 516 Formula
Method 3 uses the IEEE Std 516 formula:

$$D=(C_1 \times C_2 + a) \times \text{p.u.} \times V_{rms,ph-g} \quad \text{(ft, kV)},$$

where a is the "air saturation factor" obtained from graphs in [A-2] and $C_1$ and $C_2$ are also found in [A-2](from this reference, $C_1$ is always set at 0.01; $C_2$ is a value which ranges between 1.0 with no tool in the air gap to 1.2 depending on the insulating tool in the gap). For the present application, $C_2$ is set at 1.1.

The CRIEPI Formula
Method 4 uses the CRIEPI formula:

$$U_{50}=1080 \times \ln(0.46 \times D+1) \quad \text{(kV,m)}$$

The Lemke Formula
Method 5 uses the Lemke formula:

$$U_{50}=450 \times D+20 \quad \text{(kV,m)}$$

Conclusions

For the preferred embodiment of the present PPAG device, the following conclusions are made:
the electrodes of the PPAG are to be ½" steel rods;
the tips of the steel rods are to be hemispherical; and
the resulting formulae provide a theoretical range for air gap distances.

The method of the present invention further includes the following steps:
reviewing detailed construction drawings of various structures supporting the line voltages for which the PPAGs are to be deployed. The drawings are analyzed with the focus on those structures with the shortest phase-structure distances. (This allows the selection of the "worst-case" structures for testing. Shortest distances are "worst-case" for two reasons (1) available physical distance for the worker to work within, and, (2) greatest influence of the structure due to closest proximity to the PPAG. If distances are large, the worker can have more space to work in, and withstand and breakdown p.u. values can be increased.);

The performance of the PPAG must be validated by installing a prototype PPAG in a full-scale worksite mockup and perform testing with ac and switching impulse voltages using the air gap distances determined based on the five methods, together with other information, such as the relevancy of a particular gap-determining method to the situation at hand, the size and configuration of the tower support structure, etc. to set a particular starting gap distance.

Individual switching impulse tests are then performed in accordance with the industry standard, up-and-down method to determine the $U_{50}$ values.

Each test sequence is corrected for atmospheric conditions according to industry accepted standards.

The starting air gap distances selected are then adjusted appropriately according to the test results to best meet the design criteria (withstand and break down p.u. factors) of the utility.

References

[A-1] EPRI, "Sparkover Performance and Gap Factors of Air Gaps Below 1 Meter: Analysis of Published Data", EPRI Report TR-106335, December 1996.
[A-2] IEEE Std 516-1995 (Revision of IEEE Std 516-1987), "IEEE Guide for Maintenance Methods on Energized Power Lines", IEEE, New York, N.Y. 1995.
[A-3] IEEE Std 4-1995 (Revision of IEEE Std 4-1978), "IEEE Standard Techniques for High-Voltage Testing", IEEE, New York, N.Y. 1995.

Definitions of Terms

Definitions of selected terms which may be used in this application are found in the IEEE dictionary, IEEE Std 100-1992, *The new IEEE Standard Dictionary of Electrical and Electronics Terms*, Fifth Edition, Institute of Electrical and Electronics Engineers, New York, 1993. It should be consulted for definitions of other terms used herein but not defined hereinafter.

Critical Wave. The transient overvoltage (TOV) with the time to peak that produces the lowest 50% sparkover voltage of the gap.

Flashover (general). A disruptive discharge through air around or over the surface of solid or liquid insulation, between parts of different potential or polarity, produced by the application of voltage wherein the breakdown path becomes sufficiently ionized to maintain an electric arc.

Gap Factor. The dimensionless ratio of: (1) the $U_{50}$ value for the gap under consideration to (2) the $U_{50}$ value for a rod-to-plane gap with the same gap length.

Sparkover (high voltage testing). Term used when a disruptive discharge occurs in a gaseous or liquid dielectric.

Standard deviation. The square root of the variance of a random variable. For this application, the variance is a measure of the variation of the observations within a measurement set. The standard deviation is often estimated using a set of measurements of the random variable. The standard deviation has the same units as the measured quantity, and therefore is particularly convenient when describing the variability of the measured quantity. The parameter may also be expressed as a relative standard deviation (i.e., as a percentage of the measured quantity).

Standard lightning impulse (power and distribution transformer). An impulse that rises to crest value of voltage in 1.2 µs (virtual time) and drops to 0.5 crest value of voltage in 50 µs (virtual time), both times being measured from the same origin and in accordance with established standards of impulse testing techniques. It is described as a 1.2/50 µs impulse.

Standard switching impulse (power and distribution transformer). A full impulse having a front time of 250 µs and a time to half value of 2500 µs. It is described as a 250/2500 impulse.

Transient overvoltage (power switchgear). The peak voltage during the transient conditions resulting from the operation of a switching device.

$U_{50}$. The peak value of the applied TOV that is associated with a 50% probability of sparkover (analogous to a 50% probability of withstand).

Withstand voltage (high voltage testing). The voltage that electrical equipment (the air gap in this case) is capable of withstanding without failure or disruptive discharge (i.e., sparkover) when tested under specified conditions.

The Gap Factor

The rod-to-plane air gap, which is considered to represent the most non-homogeneous field distribution between electrodes, typically results in the lowest sparkover voltage. Therefore, the rod-to-plane air gap is the gap configuration best suited to serve as a basic reference for defining and calculating the gap factor. It should also be noted that nearly all large (i.e., greater than 1 or 2 m) air gap configurations of practical interest spark over at a lower positive voltage than negative voltage. This is also typically true for small gaps (less than 1 m). Therefore, the gap factor is calculated in this application only for the positive polarity applied voltages. The gap factor for AC energization is calculated using the peak sparkover voltages.

The gap factor, $\underline{k}$, is defined traditionally for large air gaps as the ratio of: (1) the $U_{50(gap)}$, the 50% probability of sparkover voltage for the particular gap, to (2) the $U_{50(rod-to-plane)}$, the 50% probability of sparkover voltage for a rod-to-plane gap of the same air distance between electrodes:

$$\text{GAP FACTOR} = k = U_{50(gap)}/U_{50(rod\text{-}to\text{-}plane)} \quad \text{(A.1—1)}$$

The same definition, Eq. (A.1—1), is used in this application for air gaps smaller than 1 m. The concept of the gap factor is useful in determining the $U_{50}$ values for various air gaps with electrode shapes other than rod and plane. When the length of the gap (i.e., the distance between the electrodes) with a particular electrode arrangement is known, and the gap factor for this gap is also known [A-1] then the $U_{50(gap)}$ of this gap can be determined by multiplying the gap factor, k, by the $U_{50(rod\text{-}to\text{-}plane)}$ value, which is available from test data for rod-to-plane gaps (see FIG. 10). The gap factor used in the three determinations made herein, i.e., for 115/138, 230 and 345 kV systems, is 1.30.

Factors Found to Affect the Switching Impulse Sparkover Performance of Air Gaps

Effects of Electrode Geometry

The switching impulse sparkover voltage value, $U_{50}$, of an air gap is significantly affected by the geometry of the electrodes. For all voltage types (AC, DC, impulse), electrodes with sharp protrusions have a low sparkover voltage, while rounded, smooth electrodes have a high sparkover voltage. For example, a rod-to-plane gap is characterized by the lowest sparkover voltage, whereas a parallel-plane gap has the highest sparkover voltage (if care is taken to eliminate edge effects by shaping the plane edges into Rogowski profiles). FIG. 16 contains excerpts from data presented hereinafter and shows examples of the effects of several different electrode geometries on the sparkover voltage, $U_s$, of air gaps energized with the AC. The trend is generally similar for other voltage types and impulse wave shapes. Some data show apparently inconsistent behavior due to the occurrence and effects of electrode corona. The parallel-plate sparkover data are calculated based on the breakdown strength of air of 3000 kV/m.

Effects of Voltage Type and Wave Shape

The sparkover voltage of an air gap depends strongly on the type of the applied voltage: AC, DC, or impulse. FIG. 17 gives examples of sparkover voltages of the rod-to-plane and the hoop-to-plane air gaps for various types of applied voltages.

The switching impulse voltage is characterized by its wave shape, i.e., the time to crest and the time to half-value. The primary parameter affecting the 50% probability of sparkover voltage, $U_{50}$, is the time to crest, $t_{cr}$, of the applied switching impulse wave form. FIG. 18 shows the effects of the wave shape of the applied impulse for a vertical 0.5 m (or 0.508 m) rod-to-plane air gap.

Effects of Voltage Polarity

For asymmetrical air gaps with one electrode grounded, the sparkover voltage is dependent upon the polarity of the voltage applied to the energized electrode. The air gap is said to be energized with positive polarity voltage when the high voltage terminal of the voltage source is positive with respect to the grounded electrode of the gap. For typical air gap and electrode geometries, the positive-polarity sparkover voltage is usually smaller in magnitude than the negative-polarity sparkover voltage. FIG. 19 shows the effects of polarity on an asymmetrical vertical 0.5 m (or 0.508 m) rod-to-plane air gap.

The positive- and negative-polarity sparkover voltage values are the same in magnitude for symmetric gaps such as a horizontal rod-to-rod gap high above the ground and far away from other objects.

Effects of Atmospheric Conditions

The breakdown voltage of air gaps also depends on atmospheric conditions at the instant of breakdown. In order to facilitate comparisons of test results from tests that may have been performed under different atmospheric conditions, normal industry practice allows the use of agreed-upon correction factors to adjust the test results to standard atmospheric conditions [A-3], i.e., a temperature of 20° C., pressure of 101.3 kPa, and humidity of 11 g/m³. Two adjustments for atmospheric conditions are used: the air-density correction factor, $k_d$, and the humidity-correction factor, $k_h$. The corrected breakdown voltage value, $U_{corr}$, which corresponds to the breakdown value at the standard atmospheric conditions, is then calculated as:

$$U_{corr} = U_{bkd} \times k_h / k_d \quad (1\text{—}1)$$

where:

$U_{bkd}$ is the breakdown voltage obtained from a test under nonstandard atmospheric conditions.

The adjustment procedure described above is used for positive-polarity breakdown results. For negative polarity, the correction factors are taken as 1.000.

The correction factor, $k_d$, for air density is given as:

$$k_d = \left(\frac{p}{p_o}\right)^m \times \left(\frac{273 + t_o}{273 + t}\right)^n \quad (1\text{-}2)$$

where:
p is the atmospheric pressure during the test
$p_o$ is the reference pressure corresponding to standard atmospheric conditions ($p_o$=260 mm Hg)
$t_o$ is the reference temperature during the test
t is the temperature during the test
m, n are parameters obtained from curves[A-3]

The humidity correction factor, $k_h$, is given as $$k_h = k^w \quad (1\text{-}3)$$

where:
k is a function of the absolute humidity during the test
w is a parameter obtained from curves[A-3]

The correction for air density is explained by Paschen's Law, which states that the breakdown voltage for a uniform air gap (such as the parallel plate gap) is a function of the product of the pressure and gap length.

For breakdown of air gaps energized with switching impulse, as temperature increases, the air-density correction factor, $k_d$, decreases, and the breakdown voltage also decreases (See Equation 1—1). Therefore, the minimum of the curve of $U_{50}$ as function of the time to crest, $t_{cr}$, also decreases. The critical time to crest does not change, however.

The effect of increasing humidity is somewhat different: the minimum value of $U_{50}$ is shifted to a lower value of time to crest, $t_{cr}$, but this minimum $U_{50}$ has a higher value (higher sparkover voltage level) than at a lower humidity.

Referring now to FIG. 20 and FIG. 21, a portion of a PPAG apparatus employing a rod-rod gap configuration is depicted. The apparatus employs an insulating rod ("hot stick") 110. Secured to one end of the hot stick is a metal, conductive end cap 112. Mechanically and electrically connected to the end cap is a transmission line clamp 114.

Spaced along the length of the hot stick and secured thereto is a metal, conductive collar 116. As viewed in FIG. 23, the hot stick is seen to extend in length, beyond the metal collar 116, a further segment 118, to an end point, which can include, for example, a threaded end cap to permit extensions to the insulating rod.

Affixed to the hot stick 110 are the elements that form the PPAG of the present invention. They include a first electrode member 120 which is welded to the end cap 112 at a flanged end, 122. The electrode member includes an angled segment 124 extending upward from the flange end 120 as viewed in FIGS. 20 and 21. The angled segment at its distal end terminates in a segment 126 which is disposed parallel to the longitudinal axis of the rod 110. As seen in FIG. 22A, the segment 126 has a finished hemispherical tip.

Another element of the PPAG comprises a second electrode member 128. It includes an end flange 130 which is welded to the metal collar 116. It also includes an angled segment 132 which terminates at its distal end in a horizontal segment 134. The electrode members are secured to the insulating rod such that the longitudinal axis 136 of segment 134 is coaxial with the longitudinal axis 138 of segment 126. The second electrode member 128 acts as the ground electrode to which a grounding cable 129 will be attached. The cable is secured at its other end 131 to the tower structure (see FIG. 23).

Referring to FIG. 22A, other elements of one adaptation of the apparatus of the present invention are shown. This adaptation allows for the utilization of an adjustable tip 140, of varying length, to set up the gap distance D depending on the voltage transmission lines to be serviced.

This adaptation includes a steel collar element, 142, which is welded to the end of horizontal segment 134. The collar is internally threaded as schematically portrayed in FIG. 22A. The adjustable tip 140 including a threaded end portion is inserted into the threaded opening of the steel collar 142. The adjustable tip 140 is of varying lengths for this version of the PPAG of the invention depending on the voltage of the line to be serviced. The table in FIG. 22B shows the length L for each of the nominal line voltages indicated and the range for recommended gap distances developed from the methodology, including testing, set forth above. The tip end 144 is similarly, preferably, hemispherical in shape.

For each voltage the appropriately sized tip is selected; and the threaded end inserted into the threaded collar. The tip length is adjustable in the threaded collar. This is an advantage during the testing stage to allow for changes to the gap distance D as testing leads to an optimization of this value based on the above discussion. Eventually, final. recommended values are reached. In the cases detailed above for the assignee's various structures and the performance criteria set out above, recommended values for D for the indicated voltages were determined to be:

115/138 kV, D=12";

230 kV, D=19.5";

345 kV, D=32.5".

Once these nominal values are determined, PPAGs having fixed electrodes where the gap distance D is set to a respective nominal value are fabricated for each line voltage to be serviced.

It is important for the reader hereof to understand that the determination of gap distances includes an extended testing program which is unique to a given utility's performance criteria and structures. The reader is cautioned not to assume that the nominal D values set out immediately above for comparable line voltages will work in a safe manner for their particular situation.

While a preferred methodology and device has been described, it is to be understood, of course, that variations and changes to these will be apparent to those of skill in this art. The invention, of course, is not to be limited to what is disclosed. The true breadth of the invention can only be measured and limited by the scope of the claims which follow.

What is claimed is:

1. A method for designing and validating, including testing, a portable protective air gap (PPAG) device including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\ ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, the method comprising the steps of:

(a) establishing a set of performance criteria to consider in the design and testing effort including one or more of at least the following,
  (i) the PPAG should not sparkover under nominal maximum, AC system voltage,
  (ii) setting a withstand p.u.(per unit) factor of the PPAG at a predetermined value,
  (iii) setting a breakdown p.u. factor of the PPAG at a predetermined value, and,
  (iv) deciding an expected location for the PPAG, from the group consisting of a location on the tower support structure or a location off the tower support structure;

(b) identifying a set of important parameters that affect the sparkover voltage for a specific air gap of the PPAG design, including,
  (i) the geometry of said first and second electrode,
  (ii) the shape of an applied voltage to be used during a testing phase of the PPAG design,
  (iii) the polarity of said applied voltage,
  (iv) the proximity of the air gap of the PPAG to other objects, including the tower support structure,
  (v) atmospheric conditions, and,
  (vi) the material of the first and second electrodes;

(c) performing a series of determinations and calculations, including,
  (i) determining a nominal system kilovoltage rating, phase to phase, $kV_{rms\ ph\text{-}ph}$, of the power frequency system,
  (ii) calculating a nominal maximum system voltage, phase to phase, $kV_{rms\ ph\text{-}ph}$, by multiplying the value in step (c)(i) by a factor based on the known or anticipated variation in voltage from the nominal system voltage in step (c)(i),
  (iii) calculating a phase-ground, nominal maximum system voltage, $kV_{rms,\ ph\text{-}g}$, (max), by dividing the result of step (c)(ii), by $\sqrt{3}$,
  (iv) calculating a peak, phase-ground, nominal maximum system voltage, $kV_{peak,\ ph\text{-}gr}$, by multiplying the result of step (c)(iii), by $\sqrt{2}$,
  (v) stating the withstand p.u. factor, as established by the utility,
  (vi) calculating a required withstand voltage by multiplying the result of step (c)
  (iv) by the p.u. factor stated in step (c)(v),
  (vii) stating an acceptable value of σ, where σ is the standard deviation,
  (viii) calculating a $U_{50}$ value from the required withstand voltage value by dividing the result of step (c)(vi) by the factor (1−3×σ), where $U_{50}$ is a peak voltage value where there is a 50% probability of sparkover,
  (ix) calculating a first breakdown voltage value, from the withstand voltage value by multiplying step (c)(viii) by the factor (1+3×σ),
  (x) stating the breakdown p.u. factor provided in the performance criteria,
  (xi) calculating a second breakdown voltage based on the breakdown p.u. factor, by multiplying the result of step (c)(viii) by step (c)(x),
  (xii) stating a first material factor for the material used to form the first and second electrode,
  (xiii) stating a second material factor based on the shape of the first and second electrode,
  (xiv) stating a location factor based on the expected location of the PPAG at the worksite,
  (xv) calculating a first corrected value for $U_{50}$ by multiplying step (c)(viii) by each of the factors stated in steps (c)(xii), (c)(xiii) and (c)(xiv),
  (xvi) obtaining a first D value for the gap distance between the first and second electrode from a set of test data for horizontal rod-rod gaps for the first corrected value for $U_{50}$ determined in step (c)(xv),
  (xvii) obtaining a second D value for the gap distance between the first and second electrode from a set of test data for vertical rod-rod gaps for the first corrected value for $U_{50}$ determined in step (c)(xv),
  (xviii) determining an air saturation factor, a, and constants $C_1$ and $C_2$ for calculating a third D value for the gap distance between the first and second electrode using a predetermined formula, $D=(C_1 \times C_2+a) \times (p.u\ as\ stated\ in\ step\ (c)(v)) \times V_{rms,\ ph\text{-}g}$,
  (xix) calculating the third D value for the gap distance between the first and second electrode using the predetermined formula, $D=(C_1 \times C_2+a) \times (p.u\ as\ stated\ in\ step\ (c)(v)) \times V_{rms,\ ph\text{-}g}$,
  (xx) stating a gap factor, k, to establish a further correction of the value for $U_{50}$ determined in step (c)(xv), such that the difference in performance of rod-rod and rod-plane gaps is compensated for,
  (xxi) using the formula, $U_{50}/k=1080 \times \ln(0.46 \times D+1)$, where $U_{50}$ is the first corrected value for $U_{50}$ from step (c)(xv), calculate a fourth value of D for the gap distance between the first and second electrode, and,
  (xxii) using the formula, $U_{50}/k=450 \times D+20$, where $U_{50}$ is the first corrected value for $U_{50}$ from step (c)(xv), calculate a fifth value of D for the gap distance between the first and second electrode;

(d) determining the shortest phase to structure distances for the tower support structure supporting the line voltages in which the PPAG is to be deployed;

(e) building a prototype PPAG, $PPAG_{proto}$, having an initial gap distance, $D_{initial}$, for the gap distance between the first and second electrode, said initial gap distance selected based in part on a range of D values determined in steps (c)(xvi), (c)(xvii), (c)(xix), (c)(xxi) and (c)(xxii);

(f) installing the $PPAG_{proto}$ built in step (c), on or off, depending on the choice made in step (a)(iv), a full-scale worksite mockup, the mockup including, at least, the tower support structure supporting at least one phase of the multiphase, electrical voltage transmission line network of known nominal system voltage, and including the shortest phase-structure distance determined in step (d);

(g) powering said at least one phase of the multiphase, electrical voltage transmission line network of known nominal system voltage, with said known nominal system voltage;

(h) testing the $PPAG_{proto}$ for its respective breakdown voltage by superimposing a switching impulse voltage source upon said at least one phase, said switching impulse voltage source capable of producing a plurality of peak impulse voltages of known, varying magnitude in combination with a plurality of differing front times of known varying magnitude, the plurality of peak impulse voltages, when added to the calculated peak, phase-ground, nominal maximum system voltage, $kV_{peak,\,ph\text{-}gr}$, determined in step (c)(iv), equaling a respective total peak voltage of respective peak magnitude, said respective total peak voltage of respective peak magnitude spanning between values below and above said $U_{50}$ value determined in step (c)(xv) depending on the various ones of said plurality of peak impulse voltages superimposed upon said at least one phase;

(i) ascertaining the actual breakdown voltage of the $PPAG_{proto}$ under test in step (h); and, (j) adjusting the gap distance, $D_{initial}$, if required, and repeat steps (h), (i) and (j), as required, until the adjusted gap distance results in an actual breakdown voltage that is in acceptably close proximity to the $U_{50}$ value in step (c)(xv).

2. The method claimed in claim 1 wherein the withstand p.u.factor in step (c)(v) is 1.3.

3. The method claimed in claim 2 wherein the value of σ is 0.05.

4. The method claimed in claim 1 wherein the breakdown p.u.factor in step (c)(x) is 1.7.

5. The method claimed in claim 4 wherein the value of σ is 0.05.

6. The method claimed in claim 1 wherein the value of σ is 0.05.

7. The method claimed in claim 1 wherein the material of said first and second electrodes is steel and said first material factor is 1.0.

8. The method claimed in claim 7 wherein said first and second electrodes are ½" round rods with hemispherical tips and said second material factor is 1.0.

9. The method claimed in claim 8 wherein the $PPAG_{proto}$ is located in the tower structure and the location factor is 1.1.

10. The method claimed in claim 1 wherein said first and second electrodes are each a ½" round rod with hemispherical tip and said second material factor is 1.0.

11. The method claimed in claim 1 wherein the $PPAG_{proto}$ is located in the tower structure and the location factor is 1.1.

12. The method claimed in claim 1 wherein the testing in accordance with step (h) is performed in accordance with an up-and-down method to determine the $U_{50}$ values.

13. The method claimed in claim 1 wherein the testing in accordance with step (h) is corrected for atmospheric conditions.

14. A universal $PPAG_{actual}$ device including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\,ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, The $PPAG_{actual}$ device for actual use by placement at a worksite, wherein each of said first and second electrodes are straight round rods, each said electrode having a hemispherical tip, said first and second electrodes coaxially aligned on an axis with each other such that said respective hemispherical tips are disposed on said axis facing each other, and axially distant from each other along said axis by a gap distance, $D_{actual}$, at least one of said electrodes having a varying length dependent at least on the known, nominal system voltage for the particular multiphase, electrical voltage network supported by the at least two tower support structures so that voltage sparkover will be protected against for different nominal system voltages by utilizing said at least one electrode of varying lengths for respective different nominal system voltages such that $D_{actual}$ is smaller for lower nominal system voltages, wherein the universal $PPAG_{actual}$ device is designed and validated in accordance with the method of claim 1 comprising the steps of:

(a) establishing a set of performance criteria to consider in the design and testing effort including one or more of at least the following,
 (i) the PPAG should not sparkover under nominal maximum, AC system voltage,
 (ii) setting a withstand p.u.(per unit) factor of the PPAG at a predetermined value,
 (iii) setting a breakdown p.u. factor of the PPAG at a predetermined value, and,
 (iv) deciding an expected location for the PPAG, from the group consisting of a location on the tower support structure or a location off the tower support structure;

(b) identifying a set of important parameters that affect the sparkover voltage for a specific air gap of the PPAG design, including,
 (i) the shape of an applied voltage to be used during testing phase of the PPAG design,
 (ii) the polarity of said applied voltage,
 (iii) the proximity of the air gap of the PPAG to other objects, including the tower support structure, (iv) atmospheric conditions, and,
(v) the material of the first and second electrodes, wherein said material is steel;
(c) performing a series of determinations and calculations, including,
(i) determining a nominal system kilovoltage rating, phase to phase, $kV_{rms\ ph\text{-}ph}$ of the power frequency system,
(ii) calculating a nominal maximum system voltage, phase to phase, $kV_{rms\ ph\text{-}ph}$, by multiplying the value in step (c)(i) by a factor based on the known or anticipated variation in voltage from the nominal system voltage in step (c)(i),
(iii) calculating a phase-ground, nominal maximum system voltage, $kV_{rms,\ ph\text{-}g}$, (max), by dividing the result of step (c)(ii), by $\sqrt{3}$,
(iv) calculating a peak, phase-ground, nominal maximum system voltage, $kV_{peak,\ ph\text{-}gr}$, by multiplying the result of step (c)(iii), by $\sqrt{2}$,
(v) stating the withstand p.u. factor, as established by the utility,
(vi) calculating a required withstand voltage by multiplying the result of step (c)
(iv) by the p.u. factor stated in step (c)(v),
(vii) stating an acceptable value of $\sigma$, where $\sigma$ is the standard deviation,
(viii) calculating a $U_{50}$ value from the required withstand voltage value by dividing the result of step (c)(vi) by the factor $(1-3\times\sigma)$, where $U_{50}$ is a peak voltage value where there is a 50% probability of sparkover,
(ix) calculating a first breakdown voltage value, from the withstand voltage value by multiplying step (c)(viii) by the factor $(1+3\times\sigma)$,
(x) stating the breakdown p.u. factor provided in the performance criteria,
(xi) calculating a second breakdown voltage based on the breakdown p.u. factor, by multiplying the result of step (c)(viii) by step (c)(x),
(xii) stating a first material factor of 1.0 for the material used to form the first and second electrode,
(xiii) stating a second material factor of 1.0 based on the shape of the first and second electrode,
(xiv) stating a location factor from the group consisting of 1.0 or 1.1 based on the expected location of the PPAG at the worksite,
(xv) calculating a first corrected value for $U_{50}$ by multiplying step (c)(viii) by each of the factors stated in steps (c)(xii), (c)(xiii) and (c)(xiv),
(xvi) obtaining a first D value for the gap distance between the first and second electrode from a set of test data for horizontal rod-rod gaps for the first corrected value for $U_{50}$ determined in step (c)(xv),
(xvii) obtaining a second D value for the gap distance between the first and second electrode from a set of test data for vertical rod-rod gaps for the first corrected value for $U_{50}$ determined in step (c)(xv),
(xviii) determining an air saturation factor, a, and constants $C_1$ and $C_2$ for calculating a third D value for the gap distance between the first and second electrode using a predetermined formula, $D=(C_1\times C_2+a)\times(\text{p.u. as stated in step (c)(v)})\times V_{rms\ ph\text{-}gr}$,
(xix) calculating the third D value for the gap distance between the first and second electrode using the predetermined formula, $D=(C_1\times C_2+a)\times(\text{p.u. as stated in step (c)(v)})\times V_{rms\ ph\text{-}gr}$,
(xx) stating a gap factor, k, to establish a further correction of the value for $U_{50}$ determined in step (c)(xv), such that the difference in performance of rod-rod and rod-plane gaps is compensated for,
(xxi) using the formula, $U_{50}/k=1080\times\ln(0.46\times D+1)$, where $U_{50}$ is the first corrected value for $U_{50}$ from step (c)(xv), calculate a fourth value of D for the gap distance between the first and second electrode, and,
(xxii) using the formula, $U_{50}/k=450\times D+20$, where $U_{50}$ is the first corrected value for $U_{50}$ from step (c)(xv), calculate a fifth value of D for the gap distance between the first and second electrode;
(d) determining the shortest phase to structure distances for the tower support structure supporting the line voltages in which the PPAG is to be deployed;
(e) building a prototype PPAG, $PPAG_{proto}$, said $PPAG_{proto}$ including a respective first electrode and having an initial gap distance. $D_{initial}$, for the gap distance between the first and second electrode, said initial gap distance selected based in part on the range of D values determined in steps
(c)(xvi), (c)(xvii), (c)(xix), (c)(xxi) and (c)(xxii);
(f) installing the $PPAG_{proto}$, built in step (e), on or off, depending on the choice made in step (a)(iv), a full-scale worksite mockup, the mockup including, at least, the tower support structure supporting at least one phase of the multiphase, electrical voltage transmission line network of known nominal system voltage, and including the shortest phase to structure distance determined in step (d);
(g) powering said at least one phase of the multiphase, electrical voltage transmission line network of known nominal system voltage, with said known nominal system voltage;
(h) testing the $PPAG_{proto}$ for its respective breakdown voltage by superimposing a switching impulse voltage source upon said at least one phase, said switching impulse voltage source capable of producing a plurality of peak impulse voltages of known, varying magnitude in combination with a plurality of differing front times of known varying magnitude, each of the plurality of peak impulse voltages, when added to the calculated peak, phase-ground, nominal maximum system voltage, $kV_{peak,\ ph\text{-}gr}$, determined in step (c)(iv), equating a respective total peak voltage of respective peak magnitude, said respective total peak voltage of respective peak magnitude spanning between values below and above said $U_{50}$ value determined in step (c)(xv) depending on the various ones of said plurality of peak impulse voltages superimposed upon said at least one phase;
(i) ascertaining the actual breakdown voltage of the $PPAG_{proto}$ under test in step (h); and,
(j) adjusting the gap distance, $D_{initial}$, if required, and repeat steps (h), (i) and (j) as required, until the final adjusted gap distance, $D_{actual}$, results in an actual breakdown voltage that is in acceptably close proximity to the $U_{50}$ value in step (c)(xv), said $D_{actual}$ forming the gap distance for the $PPAG_{actual}$ device).

15. A $PPAG_{actual}$ device, designed and validated in accordance with the method of claim 1, including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\ ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, wherein the known nominal system voltage is 115/138 kV, and, wherein a gap distance, $D_{actual}$, falls in the range between 9.5 inches and 12.5 inches, wherein the $PPAG_{actual}$ device is designed and validated in accordance with the method of claim 1 comprising the steps of:

(a) establishing a set of performance criteria to consider in the design and testing effort including one or more of at least the following,
   (i) the PPAG should not sparkover wider nominal maximum, AC system voltage,
   (ii) setting a withstand p.u. (per unit) factor of the PPAG at a predetermined value,
   (iii) setting a breakdown p.u. factor of the PPAG at a predetermined value, and,
   (iv) deciding an expected location for the PPAG from the group consisting of a location on the tower support structure or a location off the tower support structure;

(b) identifying a set of important parameters that affect the sparkover voltage for a specific air gap of the PPAG design, including,
   (i) the shape of said first and second electrode, including that said first and second electrodes are each ½ inch round rods, each said electrode having a hemispherical tip, and that said first and second electrodes are to be coaxially aligned with each other along an axis such that said respective hemispherical tips are disposed on said axis, facing each other, and axially distant from each other along said axis by a gap distance,
   (ii) the shape of an applied voltage to be used during a testing phase of the PPAG design,
   (iii) the polarity of said applied voltage,
   (iv) the proximity of the air gap of the PPAG to other objects, including the tower support structure,
   (v) atmospheric conditions, and,
   (vi) the material of the first and second electrodes, wherein said material is steel;

(c) performing a series of determinations and calculations, including,
   (i) determining a nominal system kilovoltage rating, phase to phase, $kV_{rms\ ph-ph}$, of the power frequency system,
   (ii) calculating a nominal maximum system voltage, phase to phase, $kV_{rms\ ph-ph}$, by multiplying the value in step (c)(i) by a factor based on the known or anticipated variation in voltage from the nominal system voltage in step (c)(i),
   (iii) calculating a phase-ground, nominal maximum system voltage, $kV_{rms,\ ph-g}$, (max), by dividing the result of step (c)(ii), by $\sqrt{3}$,
   (iv) calculating a peak, phase-ground, nominal maximum system voltage, $kV_{peak,\ ph-gr}$, by multiplying the result of step (c)(iii), by $\sqrt{2}$,
   (v) stating the withstand p.u. factor, as established by the utility,
   (vi) calculating a required withstand voltage by multiplying the result of step (c)
   (iv) by the p.u. factor stated in step (c)(v),
   (vii) stating an acceptable value of σ, where σ is the standard deviation,
   (viii) calculating a $U_{50}$ value from the required withstand voltage value by dividing the result of step (c)(vi) by the factor (1−3×σ), where $U_{50}$ is a peak voltage value where there is a 50% probability of sparkover,
   (ix) calculating a first breakdown voltage value, from the withstand voltage value by multiplying step (c)(viii) by the factor (1+3×σ),
   (x) stating the breakdown p.u. factor provided in the performance criteria,
   (xi) calculating a second breakdown voltage based on the breakdown p.u. factor, by multiplying the result of step (c)(viii) by step (c)(x),
   (xii) stating a first material factor of 1.0 for the material used to form the first and second electrode,
   (xiii) stating a second material factor of 1.0 based on the shape of the first and second electrode,
   (xiv) stating a location factor from the group consisting of 1.0 or 1.1 based on the expected location of the PPAG at the worksite,
   (xv) calculating a first corrected value for $U_{50}$ by multiplying step (c)(viii) by each of the factors stated in steps (c)(xii), (c)(xiii) and (c)(xiv),
   (xvi) obtaining a first D value for the gap distance between the first and second electrode from a set of test data for horizontal rod-rod gaps for the first corrected value for $U_{50}$ determined in step (c)(xv),
   (xvii) obtaining a second D value for the gap distance between the first and second electrode from a set of test data for vertical rod-rod gaps for the first corrected value for $U_{50}$ determined in step (c)(xv),
   (xviii) determining an air saturation factor, a, and constants $C_1$ and $C_2$ for calculating a third D value for the gap distance between the first and second electrode using a predetermined formula, $D=(C_1 \times C_2+a) \times (p.u\ as\ stated\ in\ step\ (c)(v)) \times V_{rms,\ ph-g}$,
   (xix) calculating the third D value for the gap distance between the first and second electrode using the predetermined formula, $D=(C_1 \times C_2+a) \times (p.u\ as\ stated\ in\ step\ (c)(v)) \times V_{rms,\ ph-g}$,
   (xx) stating a gap factor, k, to establish a further correction of the value for $U_{50}$ determined in step (c)(xv), such that the difference in performance of rod-rod and rod-plane gaps is compensated for,
   (xxi) using the formula, $U_{50}/k=1080 \times \ln(0.46 \times D+1)$, where $U_{50}$ is the first corrected value for $U_{50}$ from step (c)(xv), calculate a fourth value of D for the gap distance between the first and second electrode, and,
   (xxii) using the formula, $U_{50}/k=450 \times D+20$, where $U_{50}$ is the first corrected value for $U_{50}$ from step (c)(xv), calculate a fifth value of D for the gap distance between the first and second electrode;

(d) determining the shortest phase to structure distances for the tower support structure supporting the line voltages in which the PPAG is to be deployed;

(e) building a prototype PPAG, $PPAG_{proto}$, having an initial gap distance, $D_{initial}$, for the gap distance between the first and second electrode, said initial gap distance selected based in part on a range of D values determined in steps (c)(xvi), (c)(xvii), (c)(xix), (c)(xxi) and (c)(xxii);

(f) installing the $PPAG_{proto}$ built in step (e), on or off, depending on the choice made in step (a)(iv), a full-scale worksite mockup, the mockup including, at least, the tower support structure supporting at least one phase of the multiphase, electrical voltage transmission line network of known nominal system voltage, and including the shortest phase-structure distance determined in step (d);

(g) powering said at least one phase of the multiphase, electrical voltage transmission line network of known nominal system voltage, with said known nominal system voltage;

(h) testing the $PPAG_{proto}$ for its respective breakdown voltage by superimposing a switching impulse voltage source upon said at least one phase, said switching impulse voltage source capable of producing a plurality of peak impulse voltages of known, varying magnitude in combination with a plurality of differing front times of known varying magnitude, the plurality of peak impulse voltages, when added to the calculated peak, phase-ground, nominal maximum system voltage, $kV_{peak,\ ph\text{-}gr}$, determined in step (c)(iv), equaling a respective total peak voltage of respective peak magnitude, said respective total peak voltage of respective peak magnitude spanning between values below and above said $U_{50}$ value determined in step (c)(xv) depending on the various ones of said plurality of peak impulse voltages superimposed upon said at least one phase;

(i) ascertaining the actual breakdown voltage of the $PPAG_{proto}$ under test in step (h); and, (j) adjusting the gap distance, $D_{initial}$, if required, and repeat steps (h), (i) and (j), as required, until the adjusted gap distance, $D_{actual}$, results in an actual breakdown voltage that is in acceptably close proximity to the $U_{50}$ value in step (c)(xv), said $D_{actual}$ forming the gap distance for the $PPAG_{actual}$ device.

16. The $PPAG_{actual}$ device claimed in claim 15 wherein, further, the breakdown p.u. factor is 1.7, and said gap distance, $D_{actual}$, falls in the range between 9.5 inches and 12.5 inches.

17. A $PPAG_{actual}$ device, designed and validated in accordance with the method of claim 1, including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\ ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, wherein the known nominal system voltage is 230 kV, and, wherein a gap distance, $D_{actual}$, falls in the range between 17 inches and 21 inches, wherein the $PPAG_{actual}$ device is designed and validated in accordance with the method of claim 1 comprising the steps of:

(a) establishing a set of performance criteria to consider in the design and testing effort including one or more of at least the following, (i) the PPAG should not sparkover wider nominal maximum, AC system voltage, (ii) setting a withstand p.u.(per unit) factor of the PPAG at a predetermined value, (iii) setting a breakdown p.u. factor of the PPAG at a predetermined value, and, (iv) deciding an expected location for the PPAG from the group consisting of a location on the tower support structure or a location off the tower support structure;

(b) identifying a set of important parameters that affect the sparkover voltage for a specific air gap of the PPAG design, including, (i) the shape of said first and second electrode, including that said first and second electrodes are each ½ inch round rods, each said electrode having a hemispherical tip, and that said first and second electrodes are to be coaxially aligned with each other along an axis such that said respective hemispherical tips are disposed on said axis, facing each other, and axially distant from each other along said axis by a gap distance, (ii) the shape of an applied voltage to be used during a testing phase of the PPAG design, (iii) the polarity of said applied voltage, (iv) the proximity of the air gap of the PPAG to other objects, including the tower support structure, (v) atmospheric conditions, and, (vi) the material of the first and second electrodes, wherein said material is steel;

(c) performing a series of determinations and calculations, including, (i) determining a nominal system kilovoltage rating, phase to phase, $kV_{rms\ ph\text{-}ph}$, of the power frequency system, (ii) calculating a nominal maximum system voltage, phase to phase, $kV_{rms\ ph\text{-}ph}$, by multiplying the value in step (c)(i) by a factor based on the known or anticipated variation in voltage from the nominal system voltage in step (c)(i), (iii) calculating a phase-ground, nominal maximum system voltage, $kV_{rms,\ ph\text{-}g}$, (max), by dividing the result of step (c)(ii), by $\sqrt{3}$, (iv) calculating a peak, phase-ground, nominal maximum system voltage, $kV_{peak,\ ph\text{-}gr}$, by multiplying the result of step (c)(iii), by $\sqrt{2}$, (v) stating the withstand p.u. factor, as established by the utility, (vi) calculating a required withstand voltage by multiplying the result of step (c)

(iv) by the p.u. factor stated in step (c)(v), (vii) stating an acceptable value of σ, where σ is the standard deviation, (viii) calculating a $U_{50}$ value from the required withstand voltage value by dividing the result of step (c)(vi) by the factor (1−3×σ), where $U_{50}$ is a peak voltage value where there is a 50% probability of sparkover, (ix) calculating a first breakdown voltage value, from the withstand voltage value by multiplying step (c)(viii) by the factor (1+3×σ), (x) stating the breakdown p.u. factor provided in the performance criteria, (xi) calculating a second breakdown voltage based on the breakdown p.u. factor, by multiplying the result of step (c)(viii) by step (c)(x), (xii) stating a first material factor of 1.0 for the material used to form the first and second electrode, (xiii) stating a second material factor of 1.0 based on the shape of the first and second electrode,
(xiv) stating a location factor from the group consisting of 1.0 or 1.1 based on the expected location of the PPAG at the worksite,
(xv) calculating a first corrected value for $U_{50}$ by multiplying step (c)(viii) by each of the factors stated in steps (c)(xii), (c)(xiii) and (c)(xiv),
(xvi) obtaining a first D value for the gap distance between the first and second electrode from a set of test data for horizontal rod-rod gaps for the first corrected value for $U_{50}$ determined in step (c)(xv),
(xvii) obtaining a second D value for the gap distance between the first and second electrode from a set of test data for vertical rod-rod gaps for the first corrected value for $U_{50}$ determined in step (c)(xv),
(xviii) determining an air saturation factor, a, and constants $C_1$ and $C_2$ for calculating a third D value for the gap distance between the first and second electrode using a predetermined formula, $D=(C_1 \times C_2 + a) \times (p.u \text{ as stated in step (c)(v)}) \times V_{rms, ph\text{-}g}$,
(xix) calculating the third D value for the gap distance between the first and second electrode using the predetermined formula, $D=(C_1 \times C_2 + a) \times (p.u \text{ as stated in step (c)(v)}) \times V_{rms, ph\text{-}g}$,
(xx) stating a gap factor, k, to establish a further correction of the value for $U_{50}$ determined in step (c)(xv), such that the difference in performance of rod-rod and rod-plane gaps is compensated for,
(xxi) using the formula, $U_{50}/k=1080 \times \ln(0.46 \times D+1)$, where $U_{50}$ is the first corrected value for $U_{50}$ from step (c)(xv), calculate a fourth value of D for the gap distance between the first and second electrode, and,
(xxii) using the formula, $U_{50}/k=450 \times D+20$, where $U_{50}$ is the first corrected value for $U_{50}$ from step (c)(xv), calculate a fifth value of D for the gap distance between the first and second electrode;

(d) determining the shortest phase to structure distances for the tower support structure supporting the line voltages in which the PPAG is to be deployed;

(e) building a prototype PPAG, $PPAG_{proto}$, having an initial gap distance, $D_{initial}$, for the gap distance between the first and second electrode, said initial gap distance selected based in part on a range of D values determined in steps
(c)(xvi), (c)(xvii), (c)(xix), (c)(xxi) and (c)(xxii);

(f) installing the $PPAG_{proto}$ built in step (e), on or off, depending on the choice made in step (a)(iv), a full-scale worksite mockup, the mockup including, at least, the tower support structure supporting at least one phase of the multiphase, electrical voltage transmission line network of known nominal system voltage, and including the shortest phase-structure distance determined in step (d);

(g) powering said at least one phase of the multiphase, electrical voltage transmission line network of known nominal system voltage, with said known nominal system voltage;

(h) testing the $PPAG_{proto}$ for its respective breakdown voltage by superimposing a switching impulse voltage source upon said at least one phase, said switching impulse voltage source capable of producing a plurality of peak impulse voltages of known, varying magnitude in combination with a plurality of differing front times of known varying magnitude, the plurality of peak impulse voltages, when added to the calculated peak, phase-ground, nominal maximum system voltage, $kV_{peak, ph\text{-}gr}$, determined in step (c)(iv), equaling a respective total peak voltage of respective peak magnitude, said respective total peak voltage of respective peak magnitude spanning between values below and above said $U_{50}$ value determined in step (c)(xv) on the various ones of said plurality of peak impulse voltages superimposed upon said at least one phase;

(i) ascertaining the actual breakdown voltage of the $PPAG_{proto}$ under test in step (h); and, (j) adjusting the gap distance, $D_{initial}$, if required, and repeat steps (h), (i) and (j), as required, until the adjusted gap distance, $D_{actual}$, results in an actual breakdown voltage that is in acceptably close proximity to the $U_{50}$ value in step (c)(xv), said $D_{actual}$ forming the gap distance for the $PPAG_{actual}$ device.

18. The $PPAG_{actual}$ device claimed in claim 17 wherein, said gap distance, $D_{actual}$, falls in the range between 17 inches and 21 inches.

19. A $PPAG_{actual}$ device, designed and validated in accordance with the method of claim 1, including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms, ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, wherein the known nominal system voltage is 345 kV, and, wherein a gap distance, $D_{actual}$, falls in the range between 29 inches and 33 inches, wherein the $PPAG_{actual}$ device is designed and validated in accordance with the method of claim 1 comprising the steps of:

(a) establishing a set of performance criteria to consider in the design and testing effort including one or more of at least the following,
(i) the PPAG should not sparkover wider nominal maximum, AC system voltage,
(ii) setting a withstand p.u.(per unit) factor of the PPAG at a predetermined value,
(iii) setting a breakdown p.u. factor of the PPAG at a predetermined value, and,
(iv) deciding an expected location for the PPAG from the group consisting of a location on the tower support structure or a location off the tower support structure;

(b) identifying a set of important parameters that affect the sparkover voltage for a specific air gap of the PPAG design, including,
(i) the shape of said first and second electrode, including that said first and second electrodes are each ½ inch round rods, each said electrode having a hemispherical tip, and that said first and second electrodes are to be coaxially aligned with each other along an axis such that said respective hemispherical tips are disposed on said axis, facing each other, and axially distant from each other along said axis by a gap distance,
(ii) the shape of an applied voltage to be used during a testing phase of the PPAG design,
(iii) the polarity of said applied voltage,
(iv) the proximity of the air gap of the PPAG to other objects, including the tower support structure,
(v) atmospheric conditions, and,
(vi) the material of the first and second electrodes, wherein said material is steel;
(c) performing a series of determinations and calculations, including,
(i) determining a nominal system kilovoltage rating, phase to phase, $kV_{rms\ ph\text{-}ph}$, of the power frequency system,
(ii) calculating a nominal maximum system voltage, phase to phase, $kV_{rms\ ph\text{-}ph}$, by multiplying the value in step (c)(i) by a factor based on the known or anticipated variation in voltage from the nominal system voltage in step (c)(i),
(iii) calculating a phase-ground, nominal maximum system voltage, $kV_{rms,\ ph\text{-}g}$, (max), by dividing the result of step (c)(ii), by $\sqrt{3}$,
(iv) calculating a peak, phase-ground, nominal maximum system voltage, $kV_{peak,\ ph\text{-}gr}$, by multiplying the result of step (c)(iii), by $\sqrt{2}$,
(v) stating the withstand p.u. factor, as established by the utility,
(vi) calculating a required withstand voltage by multiplying the result of step (c)
(iv) by the p.u. factor stated in step (c)(v),
(vii) stating an acceptable value of $\sigma$, where $\sigma$ is the standard deviation,
(viii) calculating a $U_{50}$ value from the required withstand voltage value by dividing the result of step (c)(vi) by the factor $(1-3\times\sigma)$, where $U_{50}$ is a peak voltage value where there is a 50% probability of sparkover,
(ix) calculating a first breakdown voltage value, from the withstand voltage value by multiplying step (c)(viii) by the factor $(1+3\times\sigma)$,
(x) stating the breakdown p.u. factor provided in the performance criteria,
(xi) calculating a second breakdown voltage based on the breakdown p.u. factor, by multiplying the result of step (c)(viii) by step (c)(x),
(xii) stating a first material factor of 1.0 for the material used to form the first and second electrode,
(xiii) stating a second material factor of 1.0 based on the shape of the first and second electrode,
(xiv) stating a location factor from the group consisting of 1.0 or 1.1 based on the expected location of the PPAG at the worksite,
(xv) calculating a first corrected value for $U_{50}$ by multiplying step (c)(viii) by each of the factors stated in steps (c)(xii), (c)(xiii) and (c)(xiv),
(xvi) obtaining a first D value for the gap distance between the first and second electrode from a set of test data for horizontal rod-rod gaps for the first corrected value for $U_{50}$ determined in step (c)(xv),
(xvii) obtaining a second D value for the gap distance between the first and second electrode from a set of test data for vertical rod-rod gaps for the first corrected value for $U_{50}$ determined in step (c)(xv),
(xviii) determining an air saturation factor, a, and constants $C_1$ and $C_2$ for calculating a third D value for the gap distance between the first and second electrode using a predetermined formula, $D=(C_1\times C_2+a)\times(\text{p.u as stated in step (c)(v)})\times V_{rms,\ ph\text{-}g}$,
(xix) calculating the third D value for the gap distance between the first and second electrode using the predetermined formula, $D=(C_1\times C_2+a)\times(\text{p.u as stated in step (c)(v)})\times V_{rms,\ ph\text{-}g}$,
(xx) stating a gap factor, k, to establish a further correction of the value for $U_{50}$ determined in step (c)(xv), such that the difference in performance of rod-rod and rod-plane gaps is compensated for,
(xxi) using the formula, $U_{50}/k=1080\times\ln(0.46\times D+1)$, where $U_{50}$ is the first corrected value for $U_{50}$ from step (c)(xv), calculate a fourth value of D for the gap distance between the first and second electrode, and,
(xxii) using the formula, $U_{50}/k=450\times D+20$, where $U_{50}$ is the first corrected value for $U_{50}$ from step (c)(xv), calculate a fifth value of D for the gap distance between the first and second electrode;
(d) determining the shortest phase to structure distances for the tower support structure supporting the line voltages in which the PPAG is to be deployed;
(e) building a prototype PPAG, $PPAG_{proto}$, having an initial gap distance, $D_{initial}$, for the gap distance between the first and second electrode, said initial gap distance selected based in part on a range of D values determined in steps
(c)(xvi), (c)(xvii), (c)(xix), (c)(xxi) and (c)(xxii);
(f) installing the $PPAG_{proto}$ built in step (e), on or off, depending on the choice made in step (a)(iv), a full-scale worksite mockup, the mockup including, at least, the tower support structure supporting at least one phase of the multiphase, electrical voltage transmission line network of known nominal system voltage, and including the shortest phase-structure distance determined in step (d);
(g) powering said at least one phase of the multiphase, electrical voltage transmission line network of known nominal system voltage, with said known nominal system voltage;
(h) testing the $PPAG_{proto}$ for its respective breakdown voltage by superimposing a switching impulse voltage source upon said at least one phase, said switching impulse voltage source capable of producing a plurality of peak impulse voltages of known, varying magnitude in combination with a plurality of differing front times of known varying magnitude, the plurality of peak impulse voltages, when added to the calculated peak, phase-ground, nominal maximum system voltage, $kV_{peak,\ ph\text{-}gr}$, determined in step (c)(iv), equaling a respective total peak voltage of respective peak magnitude, said respective total peak voltage of respective peak magnitude spanning between values below and above said $U_{50}$ value determined in step (c)(xv) on the various ones of said plurality of peak impulse voltages superimposed upon said at least one phase;
(i) ascertaining the actual breakdown voltage of the $PPAG_{proto}$ under test in step (h); and,
(j) adjusting the gap distance, $D_{initial}$, if required, and repeat steps (h), (i) and (j), as required, until the adjusted gap distance, $D_{actual}$, results in an actual breakdown voltage that is in acceptably close proximity to the $U_{50}$ value in step (c)(xv), said $D_{actual}$ forming the gap distance for the $PPAG_{actual}$ device.

20. The $PPAG_{actual}$ device claimed in claim 19 wherein, said gap distance, $D_{actual}$, falls in the range between 29 inches and 33 inches.

21. A method for designing and validating, including testing, a portable protective air gap (PPAG) device including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\ ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, the method comprising the steps of:

(a) establishing a set of performance criteria to consider in the design and testing effort including one or more of at least the following,
  (i) the PPAG should not sparkover under nominal maximum, AC system voltage,
  (ii) setting a withstand p.u.(per unit) factor of the PPAG at a predetermined value,
  (iii) setting a breakdown p.u. factor of the PPAG at a predetermined value, and,
  (iv) deciding that the PPAG is to be located in the tower support structure;
(b) identifying a set of important parameters that affect the sparkover voltage for a specific air gap of the PPAG design, including,
  (i) the shape of said first and second electrode,
  (ii) the shape of an applied voltage to be used during the testing phase of the PPAG design,
  (iii) the polarity of said applied voltage,
  (iv) the proximity of the air gap of the PPAG to other objects, including the tower support structure,
  (v) atmospheric conditions, and,
  (vi) the material of the first and second electrodes;
(c) performing a series of determinations and calculations, including,
  (i) determining a nominal system kilovoltage rating, phase to phase, $kV_{rms\ ph\text{-}ph}$, of the power frequency system,
  (ii) calculating a nominal maximum system voltage, phase to phase, $kV_{rms\ ph\text{-}ph}$, by multiplying the value in step (c)(i) by a factor based on the known or anticipated variation in voltage from the nominal system voltage in step (c)(i),
  (iii) calculating a phase-ground, nominal maximum system voltage, $kV_{rms,\ ph\text{-}g}$, (max), by dividing the result of step (c)(ii), by $\sqrt{3}$,
  (iv) calculating a peak, phase-ground, nominal maximum system voltage, $kV_{peak,\ ph\text{-}gr}$, by multiplying the result of step (c)(iii), by $\sqrt{2}$,
  (v) stating the withstand p.u. factor, as 1.3,
  (vi) calculating a required withstand voltage by multiplying the result of step (c)
  (iv) by the p.u. factor stated in step (c)(v),
  (vii) stating 0.05 as an acceptable value of $\sigma$, where $\sigma$ is the standard deviation,
  (viii) calculating a $U_{50}$ value from the required withstand voltage value by dividing the result of step (c)(vi) by the factor (1−3×0.05), where $U_{50}$ is a peak voltage value where there is a 50% probability of sparkover,
  (ix) calculating a first breakdown voltage value, from the withstand voltage value by multiplying step (c)(viii) by the factor (1+3×0.05),
  (x) stating the breakdown p.u. factor provided in the performance criteria, as 1.7,
  (xi) calculating a second breakdown voltage based on the breakdown p.u. factor, by multiplying the result of step (c)(viii) by step (c)(x),
  (xii) stating a first material factor of 1.0 for the material used to form the first and second electrode, where said material is steel,
  (xiii) stating a second material factor of 1.0 based on the shape of the first and second electrode, where each of said first and second electrodes is a ½" round rod with a hemispherical tip,
  (xiv) stating a location factor of 1.1 for location of the PPAG in the tower,
  (xv) calculating a first corrected value for $U_{50}$ by multiplying step (c)(viii) by each of the factors stated in steps (c)(xii), (c)(xiii) and (c)(xiv),
  (xvi) obtaining a first D value for the gap distance between the first and second electrode from a set of test data for horizontal rod-rod gaps for the first corrected value for $U_{50}$ determined in step (xv),
  (xvii) obtaining a second D value for the gap distance between the first and second electrode from a set of test data for vertical rod-rod gaps for the first corrected value for $U_{50}$ determined in step (xv),
  (xviii) determining an air saturation factor, a, and constants $C_1$ and $C_2$ for calculating a third D value for the gap distance between the first and second electrode using a predetermined formula, $D=(C_1\times C_2+a)\times(\text{p.u. as stated in step (c)(v)})\times V_{rms,\ ph\text{-}g}$,
  (xix) calculating the third D value for the gap distance between the first and second electrode using the predetermined formula, $D=(C_1\times C_2+a)\times(\text{p.u. as stated in step (c)(v)})\times V_{rms,\ ph\text{-}g}$,
  (xx) stating a gap factor, k, to establish a further correction of the value for $U_{50}$ determined in step (c)(xv), such that the difference in performance of rod-rod and rod-plane gaps is compensated for,
  (xxi) using the formula, $U_{50}/k=1080\times\ln(0.46\times D+1)$, where $U_{50}$ is the first corrected value for $U_{50}$ from step (c)(xv), calculate a fourth value of D for the gap distance between the first and second electrode, and,
  (xxii) using the formula, $U_{50}/k=450\times D+20$, where $U_{50}$ is the first corrected value for $U_{50}$ from step (c)(xv), to calculate a fifth value of D for the gap distance between the first and second electrode;
(d) determining the shortest phase to structure distances for the tower support structure supporting the line voltages in which the PPAG is to be deployed;
(e) building a prototype PPAG, $PPAG_{proto}$, having an initial gap distance, $D_{initial}$, for the gap distance between the first and second electrode, said initial gap distance selected based in part on the range of D values determined in steps (c)(xvi), (c)(xvii), (c)(xix), (c)(xxi) and (c)(xxii);
(f) installing the $PPAG_{proto}$ built in step (e), on a full-scale worksite mockup, the mockup including, at least, the tower support structure supporting at least one phase of the multiphase, electrical voltage transmission line network of known nominal system voltage, and including the shortest phase-structure distance determined in step (d);

(g) powering said at least one phase of the multiphase, electrical voltage transmission line network of known nominal system voltage, with said known nominal system voltage;

(h) testing the $PPAG_{proto}$ for its respective breakdown voltage by superimposing a switching impulse voltage source upon said at least one phase, said switching impulse voltage source capable of producing a plurality of peak impulse voltages of known, varying magnitude in combination with a plurality of differing front times of known varying magnitude, the plurality of peak impulse voltages, when added to the calculated peak, phase-ground, nominal maximum system voltage, $kV_{peak,\ ph\text{-}gr}$, determined in step (c)(iv), equaling a respective total peak voltage of respective peak magnitude, said respective total peak voltage of respective peak magnitude spanning between values below and above said $U_{50}$ value determined in step (c)(xv), depending on the various ones of said plurality of peak impulse voltages superimposed upon said at least one phase;

(i) ascertaining the actual breakdown voltage of the $PPAG_{proto}$ under test in step (h); and, (j) adjusting the gap distance, $D_{initial}$, if required, and repeat steps (h), (i) and (j) as required, until the adjusted gap distance results in an actual breakdown voltage that is in acceptably close proximity to the value in step (c)(xv).

22. The method claimed in claim 21 wherein the testing in accordance with step (h) is performed in accordance with an up-and-down method to determine the $U_{50}$ values.

23. The method claimed in claim 21 wherein the testing in accordance with step (h) is corrected for atmospheric conditions.

24. A universal portable protective air gap (PPAG) device including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\ ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, the PPAG for actual use by placement at a worksite, in one of the tower support structures, wherein each of said first and second electrodes are straight round rods, each said electrode having a hemispherical tip, said first and second electrodes coaxially aligned on an axis with each other such that said respective hemispherical tips are disposed on said axis facing each other, and axially distant from each other along said axis by a gap distance, $D_{actual}$, at least one of said electrodes having a varying length dependent at least on the known, nominal system voltage for the particular, multiphase, electrical voltage network supported by the at least two tower support structures so that voltage sparkover will be protected against for different nominal system voltages by utilizing said at least one electrode of varying lengths for respective different nominal system voltages such that $D_{actual}$ is smaller for lower nominal system voltages.

25. The universal PPAG device claimed in claim 24, where in the device can be used at any one of three different worksites, each worksite having a respective nominal system voltage of either 115/138 kV, 230 kV or 345 kV, wherein the respective first electrode for use with a respective nominal system voltage has a respective length whereby the gap distance, $D_{actual}$, falls in one of the ranges between 9.5" to 12.5", 17" to 21" or 29" to 33", respectively.

26. A portable protective air gap (PPAG) device including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\ ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, the PPAG for actual use by placement at a worksite, in one of the tower support structures, wherein each of said first and second electrodes are round rods, each said electrode having a hemispherical tip, said first and second electrodes coaxially aligned with each other such that said respective hemispherical tips are axially distant from each other by a gap distance, $D_{actual}$, and disposed facing each other, said gap distance, $D_{actual}$, a function, at least, of the known, nominal system voltage for the particular, multiphase, electrical voltage network supported by the at least two tower support structures, wherein the known nominal system voltage is 115/138 kV, and, wherein said gap distance, $D_{actual}$, falls in the range between 9.5 inches and 12.5 inches.

27. A portable protective air gap (PPAG) device including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\ ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, the PPAG for actual use by placement at a worksite, in one of the tower support structures, wherein each of said first and second electrodes are round rods, each said electrode having a hemispherical tip, said first and second electrodes coaxially aligned with each other such that said respective hemispherical tips are axially distant from each other by a gap distance, $D_{actual}$, and disposed facing each other, said gap distance, $D_{actual}$, a function, at least, of the known, nominal system voltage for the particular, multiphase, electrical voltage network supported by the at least two tower support structures, wherein the known nominal system voltage is 230 kV, and, wherein said gap distance, $D_{actual}$, falls in the range between 17 inches and 21 inches.

28. A portable protective air gap (PPAG) device including a first and second electrode, suitable for use at a worksite of a particular utility company, the worksite including at least two tower support structures, each at electrical ground potential, for supporting a multiphase, electrical voltage transmission line network used to transmit a known, power frequency system, multiphase voltage of known nominal system voltage, phase to phase, $kV_{rms,\ ph\text{-}ph}$, the transmission line network including a respective electrical transmission line for at least each phase of the multiphase voltage, each of said transmission lines suspended from a respective segment of the tower support structures by insulating electrodes, the tower support structures having a unique shape based in part on the magnitude of the power frequency system voltage transmitted on the lines of the transmission line network, the PPAG device to be suitable in design to protect a worker positioned at the worksite on or about the tower support structures, and engaged in live-line maintenance, against the possibility of voltage sparkover across one or more of a plurality of air gaps between the worker and each respective electrical transmission line, the PPAG for actual use by placement at a worksite, in one of the tower support structures, wherein each of said first and second electrodes are round rods, each said electrode having a hemispherical tip, said first and second electrodes coaxially aligned with each other such that said respective hemispherical tips are axially distant from each other by a gap distance, $D_{actual}$, and disposed facing each other, said gap distance, $D_{actual}$, a function, at least, of the known, nominal system voltage for the particular, multiphase, electrical voltage network supported by the at least two tower support structures, wherein the known nominal system voltage is 345 kV, and, wherein said gap distance, $D_{actual}$, falls in the range between 29 inches and 33 inches.

* * * * *

UNITED STATES PATENT AND TRADEMARK OFFICE
CERTIFICATE OF CORRECTION

PATENT NO. : 6,957,117 B2
DATED : October 18, 2005
INVENTOR(S) : Thomas A. Verdecchio, Raymond Ferraro and George Gela It is certified that error appears in the above-identified patent and that said Letters Patent is hereby corrected as shown below:

Column 21,
Line 55, change "geometry" to -- shape --.

Column 22,
Lines 53 and 56, after "u" insert a -- . --.

Column 23,
Line 12, change "(c)" to -- (e) --.
Line 18, after "phase", delete "-" and replace with -- to --.
Line 30, after the comma and before "the", insert -- each of --.

Column 24,
Line 29, change "The" to -- the --.
Line 64, after "during" insert -- a --.

Column 26,
Line 16, delete the period "." and replace with a comma -- , --.
Lines 42 and 43, change "equating" to -- equaling --.

Column 27,
Line 21, change "wider" to -- under --.

Column 28,
Line 44, after "u" insert a -- . --.

Column 29,
Line 17, after the comma and before "the" insert -- each of --.

Column 30,
Line 1, change "wider" to -- under --.

Column 31,
Line 52, after "phase", delete "-" and replace with -- to --.
Line 64, after the comma and before "the" insert -- each of --.

Column 32,
Line 6, after "(xv)" insert -- depending --.
Line 49, change "wider" to -- under --.

Column 34,
Line 3, after "u" insert a -- . --.

UNITED STATES PATENT AND TRADEMARK OFFICE
CERTIFICATE OF CORRECTION

PATENT NO. : 6,957,117 B2
DATED : October 18, 2005
INVENTOR(S) : Thomas A. Verdecchio, Raymond Ferraro and George Gela It is certified that error appears in the above-identified patent and that said Letters Patent is hereby corrected as shown below:

<u>Column 34 (cont'd),</u>
Line 20, insert the following section
-- (xxii) using the formula, $U_{50}/k=450 \times D + 20$, where $U_{50}$ is the first corrected value for $U_{50}$ from step (c) (xv), calculate a fifth value of D for the gap distance between the first and second electrode; --.
Line 35, after "phase" delete "-" and replace with -- to --.
Line 47, after the comma and before "the" insert -- each of --.
Line 54, after "(xv)" insert -- depending --.

<u>Column 35,</u>
Line 39, change "the" to -- a --.

<u>Column 37,</u>
Line 2, after "phase" delete "-" and replace with -- to --.

Signed and Sealed this

Twenty-first Day of February, 2006

JON W. DUDAS
*Director of the United States Patent and Trademark Office*